United States Patent
Huang et al.

(10) Patent No.: US 12,525,486 B2
(45) Date of Patent: Jan. 13, 2026

(54) ISOLATION STRUCTURE FOR METAL INTERCONNECT

(71) Applicant: Taiwan Semiconductor Manufacturing Co., Ltd., Hsinchu (TW)

(72) Inventors: Lin-Yu Huang, Hsinchu (TW); Li-Zhen Yu, New Taipei (TW); Chia-Hao Chang, Hsinchu (TW); Cheng-Chi Chuang, New Taipei (TW); Yu-Ming Lin, Hsinchu (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 211 days.

(21) Appl. No.: 16/939,994

(22) Filed: Jul. 27, 2020

(65) Prior Publication Data

US 2021/0134669 A1    May 6, 2021

Related U.S. Application Data

(60) Provisional application No. 62/928,583, filed on Oct. 31, 2019.

(51) Int. Cl.
*H01L 21/768* (2006.01)
*H01L 21/762* (2006.01)
(Continued)

(52) U.S. Cl.
CPC ...... *H01L 21/76879* (2013.01); *H01L 21/762* (2013.01); *H01L 21/76802* (2013.01);
(Continued)

(58) Field of Classification Search
CPC ..... H01L 21/76877–76883; H01L 29/36–365; H01L 29/16–2206; H01L 29/04–045; H01L 2924/13067; H01L 2029/7857–7858; H01L 29/785–7856; H01L 29/66795–66818; H01L 29/41791; H01L 27/1211; H01L 27/10879; H01L 27/10826; H01L 27/0924; H01L 27/0886; H01L 21/845; H01L 21/823821; H01L 21/823431; H01L 23/522–53295; H01L 21/768–76898; H01L 2027/11833;
(Continued)

(56) References Cited

U.S. PATENT DOCUMENTS 9,105,490 B2    8/2015    Wang et al.
9,236,267 B2    1/2016    De et al.
(Continued)

*Primary Examiner* — Julio J Maldonado
*Assistant Examiner* — Stanetta D Isaac
(74) *Attorney, Agent, or Firm* — Sterne, Kessler, Goldstein & Fox P.L.L.C.

(57) ABSTRACT

The present disclosure describes a method for forming an interconnect structure. The method can include forming a first layer of insulating material on a substrate, forming a via recess within the layer of insulating material, filling the via recess with a layer of conductive material, selectively growing a second layer of insulating material over the first layer of insulating material, and opening the second layer of insulating material to the layer of conductive material while growing the second layer of insulating material.

20 Claims, 18 Drawing Sheets

(51) Int. Cl.
  *H01L 23/522* (2006.01)
  *H10D 84/01* (2025.01)
  *H10D 84/03* (2025.01)

(52) U.S. Cl.
  CPC ..... *H01L 23/5226* (2013.01); *H10D 84/0158* (2025.01); *H10D 84/038* (2025.01)

(58) Field of Classification Search
  CPC .......... H01L 21/76807–76813; H01L 2221/1015–1036; H01L 21/76879; H01L 21/762; H01L 21/76802; H01L 21/76829; H01L 21/76897; H10D 30/6735; H10D 30/6757; H10D 84/0158; H10D 84/038
  See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2015/0018837 A1* | 1/2015 | Sartor ................ A61B 17/3205 606/114 |
| 2015/0118837 A1* | 4/2015 | Shieh .............. H01L 21/823864 438/618 |
| 2017/0114451 A1* | 4/2017 | Lecordier ........... C23C 16/0272 |
| 2018/0233350 A1* | 8/2018 | Tois .................. H01L 21/02181 |
| 2019/0148225 A1* | 5/2019 | Chen ................. H01L 21/76849 257/384 |
| 2019/0148501 A1* | 5/2019 | Chen ................... H01L 29/6653 257/288 |
| 2019/0157149 A1* | 5/2019 | Tapily ................ H01L 21/0228 |
| 2019/0164762 A1* | 5/2019 | Su ..................... H01L 21/76897 |
| 2019/0295903 A1* | 9/2019 | Clark ............... H01L 21/02636 |
| 2020/0006127 A1* | 1/2020 | Khaderbad ....... H01L 21/76834 |

\* cited by examiner

ISOLATION STRUCTURE FOR METAL INTERCONNECT

CROSS-REFERENCE TO RELATED APPLICATION

This application claims the benefit of U.S. Provisional Patent Application No. 62/928,583, titled "Constrained Placement for Heterogeneous PG-Structure Cells," which was filed on Oct. 31, 2019 and is incorporated herein by reference in its entirety.

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and nano-sheet field effect transistors (NSFETs). Such scaling down has increased the complexity of semiconductor device manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1A:
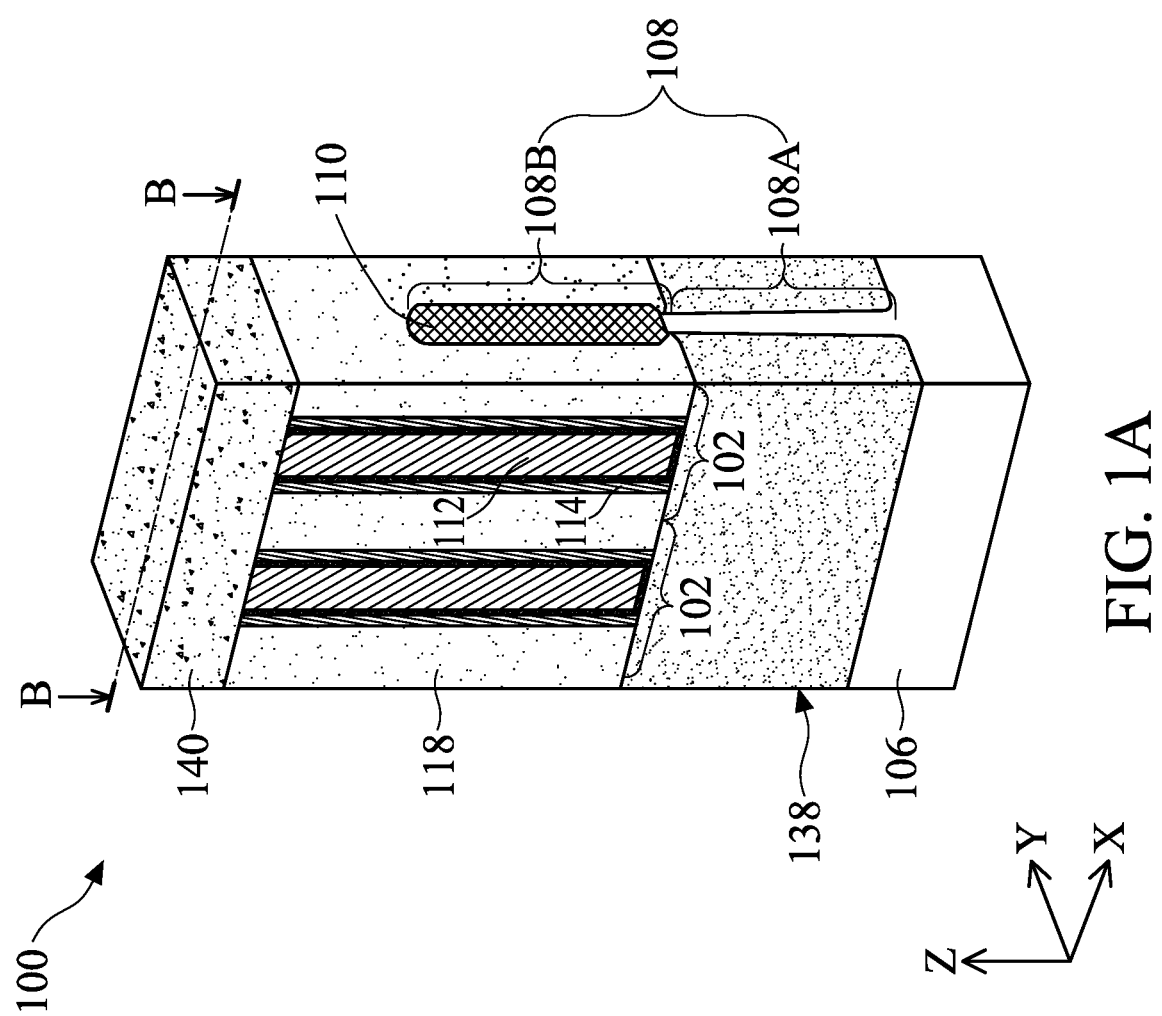
FIG. 1A illustrates isometric views of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins associated with fin field effect transistors (finFETs) or gate-all-around (GAA) FETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

As used herein, the term "vertical," means nominally perpendicular to the surface of a substrate.

As used herein, the term "insulating layer", refers to a layer that functions as an electrical insulator (e.g., a dielectric layer).

As used herein, the term "selectivity" refers to the ratio of the etch rates of two materials under a same etching condition.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

Technology advances in the semiconductor industry drive the pursuit of integrated circuits (IC)s having higher device density, higher performance, and lower cost. In the course of the IC evolution, both the transistor structure and interconnect structure are scaled down to achieve ICs with higher device densities. Such scaling down can accordingly reduce a spacing between interconnect structures and transistor contacts. Further, the spacing between interconnect structures and transistor contacts can be additionally reduced due to fabrication process variations, such as an unintentional over-polishing during the wafer planarization process. However, this separation reduction can decrease the fabrication tolerance for the IC, thus being vulnerable to a process variation during the fabrication of the IC. For example, one or more polishing steps during the fabrication of the IC can aggressively thin the dielectric layers between the interconnect structure's metal lines and the underlying transistor structures. This can cause an electrical leakage in the transistor structure, such as time-dependent dielectric breakdown (TDDB), thus degrading the yield and reliability of the IC.

The present disclosure is directed to a fabrication method and an isolation structure that enhances an electrical insulation between an interconnect structure and an underlying transistor structure within an IC. For example, the isolation structure can include an insulating layer formed between the interconnect structure and the underlying transistor structure. The insulating layer can be selectively deposited over a first portion of the transistor structure's top surface, while exposing a second portion of the transistor structure's top surface. In some embodiments, the first portion of the top surface can be a dielectric surface, and the second portion of the top surface can be a metallic surface that electrically connects to the interconnect structure. In some embodiments, the insulating layer can be selectively deposited over a first group of the transistor metal contacts, while leaving open a second group of transistor metal contacts to the interconnect structure. A benefit of the present disclosure, among others, is to utilize the insulating layer to effectively increase the separation between the interconnect structure and the underlying transistor structure, thus enhancing the electrical insulation between the structures and preventing electrical leakage failure in the IC.

Figure 1B:
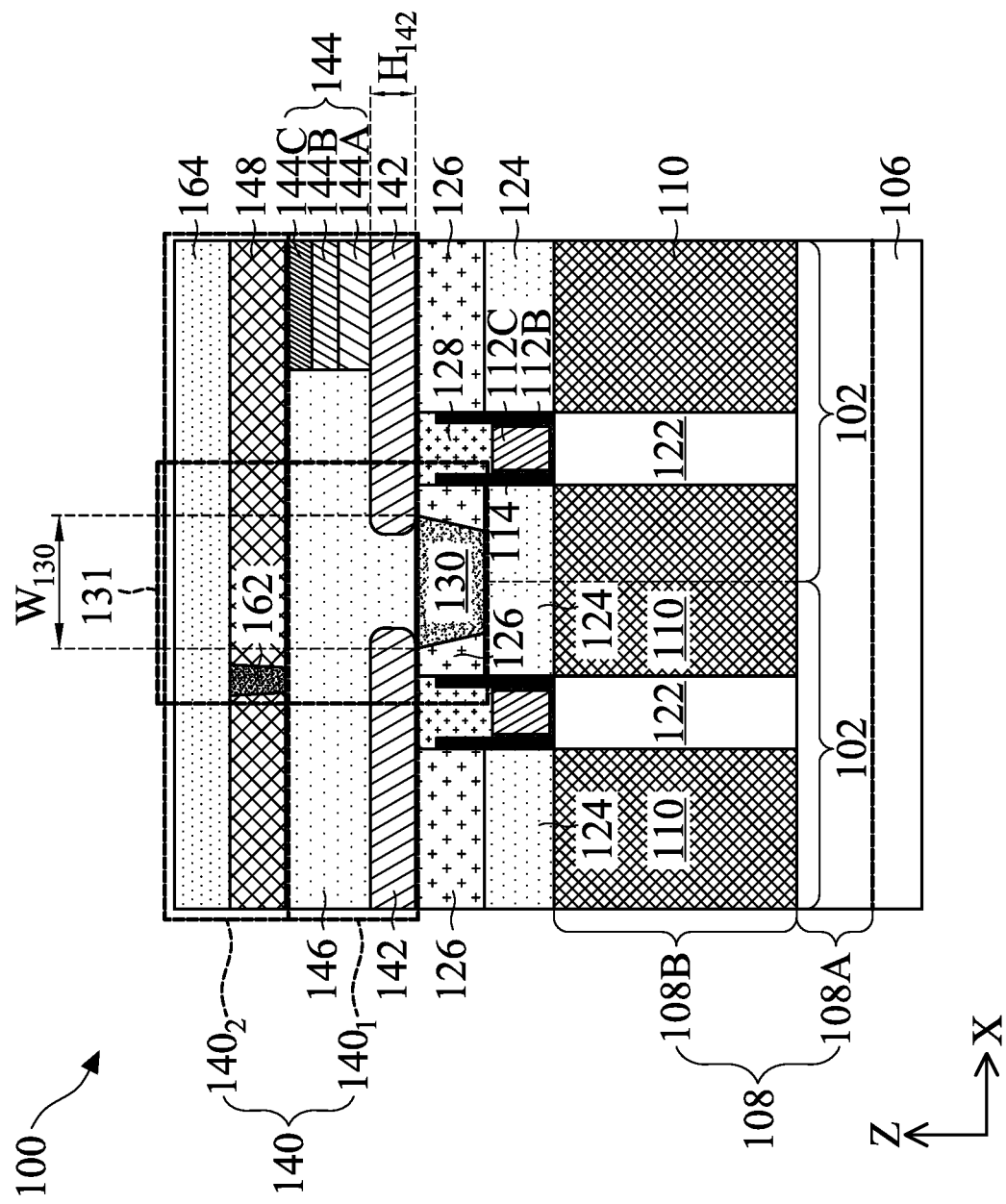
FIGS. 1B-1F illustrate cross-sectional views of a semiconductor device, according to some embodiments.
Figure 1C:
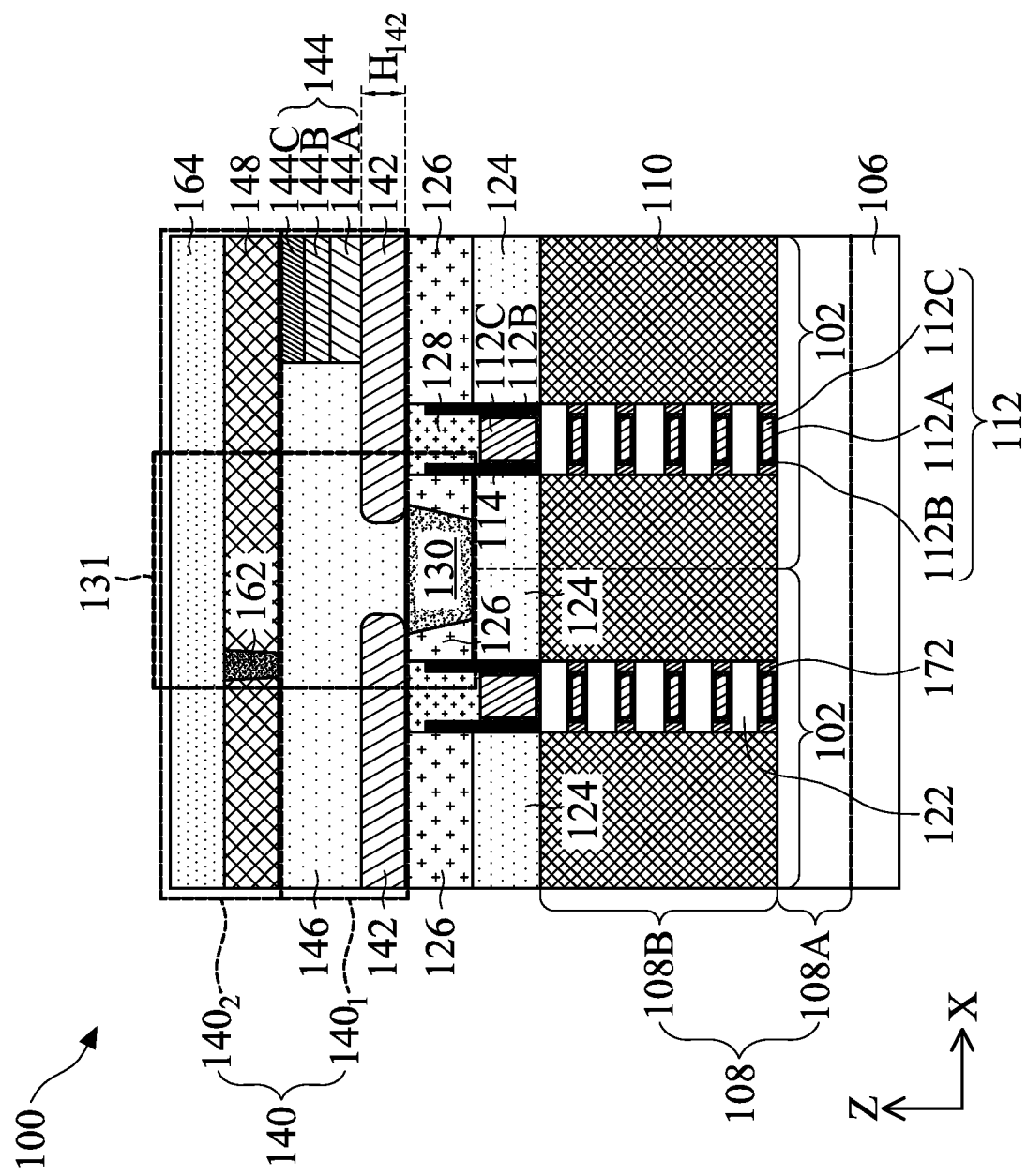
Figure 1D:
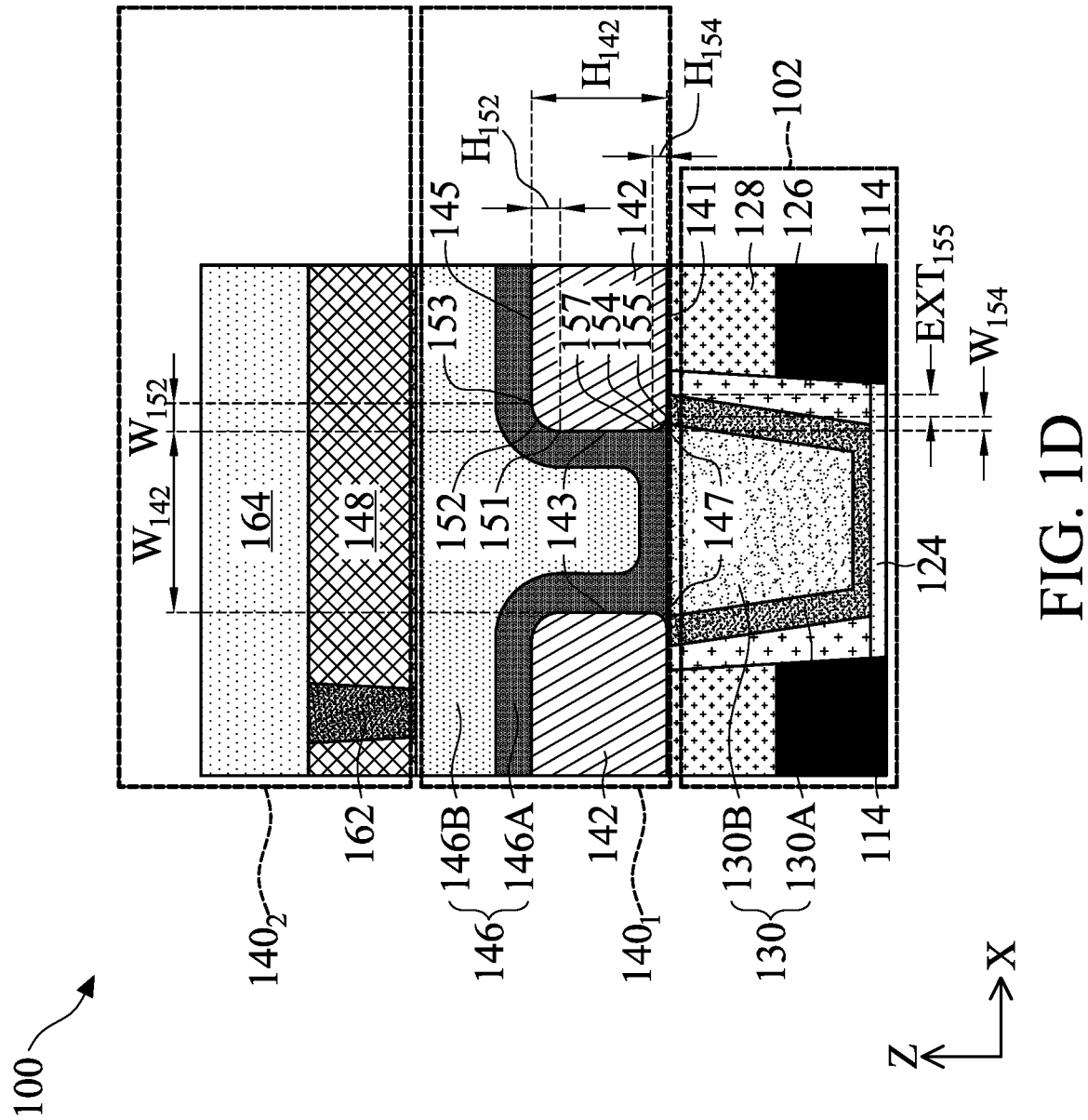
Figure 1E:
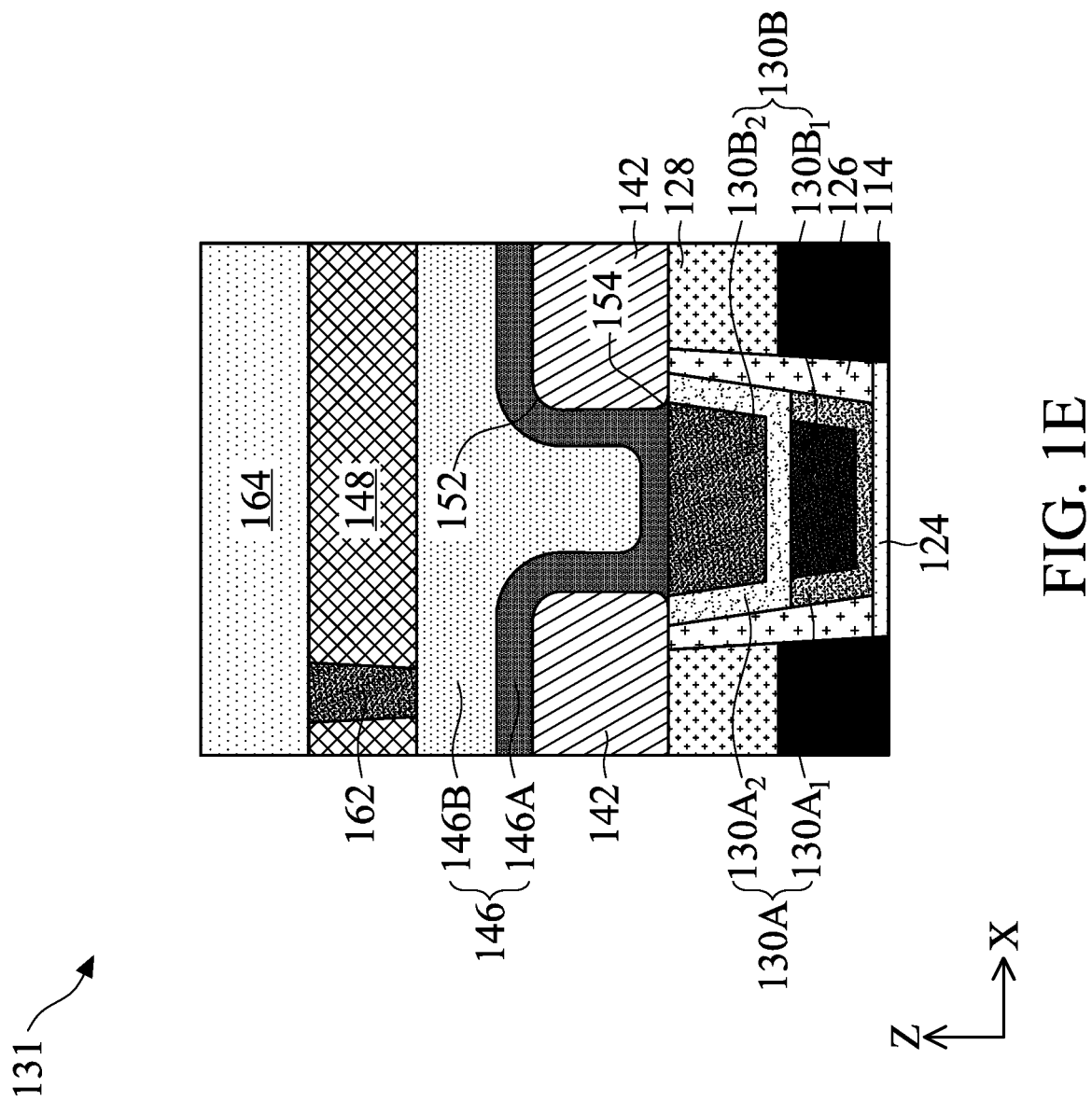
Figure 1F:
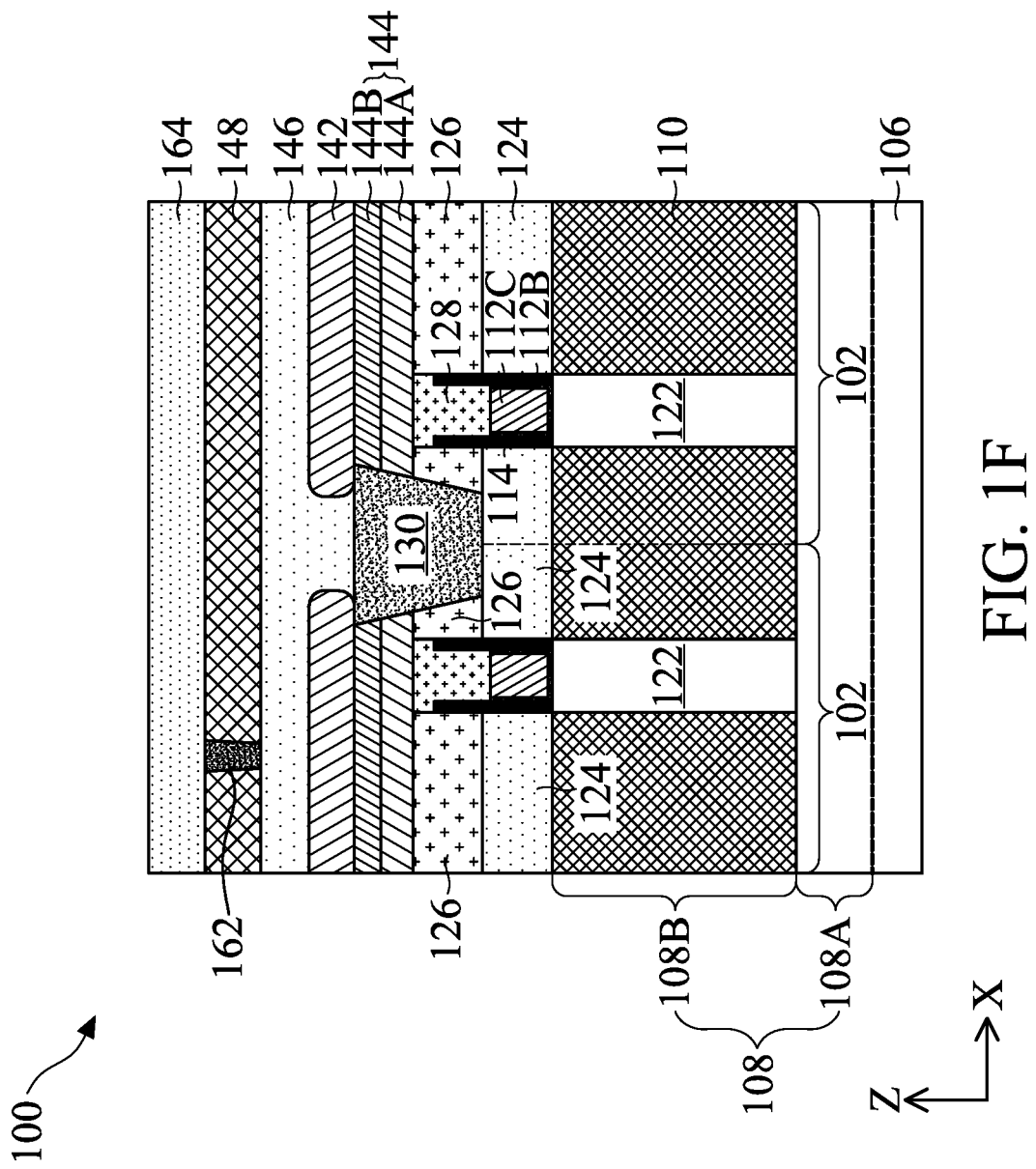

A semiconductor device 100 having multiple field effect transistors (FETs) 102 and an interconnect structure 140 disposed over FETs 102, is described with reference to FIGS. 1A-1F, according to some embodiments. FIG. 1A illustrates an isometric view of semiconductor device 100, according to some embodiments. FIGS. 1B and 1F each illustrate cross-sectional views along line B-B of semiconductor device 100 of FIG. 1A, where each FET 102 can be a fin field effect transistor (finFET), according to some embodiments. FIG. 1C illustrates a cross-sectional view along line B-B of semiconductor device 100 of FIG. 1A, where each FET 102 can be a gate-all-around (GAA) FET, according to some embodiments. FIGS. 1D and 1E illustrate cross-sectional views along line B-B of semiconductor device 100 of FIG. 1A, according to some embodiments. Semiconductor device 100 can be included in a microprocessor, memory cell, or other integrated circuit. The discussion of elements in FIGS. 1A-1F with the same annotations applies to each other, unless mentioned otherwise.

Referring to FIG. 1A, each FET 102 can include a fin structure 108 extending along an x-axis, a gate structure 112 traversing through fin structure 108 along an y-axis, and a source/drain (S/D) region 110 formed over portions of fin structure 108. Although FIG. 1A shows fin structure 108 accommodating two FETs 102, any number of FETs 102 can be disposed along fin structure 108. Each FET 102 can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) or n-type dopants (e.g., phosphorus (P) or arsenic (As)).

Semiconductor device 100 can further include shallow trench isolation (STI) regions 138 configured to provide electrical isolation for fin structure 108. For example, STI regions 138 can electrically isolate fin structure 108 from another fin structure 108 (not shown in FIG. 1A) formed in semiconductor device 100. STI regions 138 can be configured to provide electrical isolation between FETs 102 residing on fin structure 108. Also, STI regions 138 can be configured to provide electrical isolation between FETs 102 and neighboring active and passive elements (not shown in FIG. 1A) integrated with or deposited on substrate 106. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials.

Referring to FIGS. 1A-1C, fin structure 108 can include a fin base portion 108A and a stacked fin portion 108B disposed on fin base portion 108A. Fin base portion 108A can include a material similar to substrate 106, such as a material having a lattice constant substantially close to (e.g., lattice mismatch within 5%) that of substrate 106. In some embodiments, fin base portion 108A can include a material identical to substrate 106. For example, fin base portion 108A can be formed from a photolithographic patterning and an etching of substrate 106. Stacked fin portion 108B can include a semiconductor layer 122 functioning as FET 102's channel layer 122 and a S/D region 110 horizontally (e.g., in the x-direction) in contact with channel layer 122. In some embodiments, as shown in FIG. 1B, channel layer 122 can connect with fin base portion 108A and/or substrate 106. In some embodiments, as shown in FIG. 1C, stacked fin portion 108B can include multiple channel layers 122, each made of identical or different materials.

S/D region 110 can be grown over fin base portion 108A. Each of channel layers 122 of FET 102 can be interposed between a pair of S/D regions 110. S/D region 110 can include an epitaxially-grown semiconductor material. In some embodiments, the epitaxially grown semiconductor material can be the same material as the material of substrate 106. For example, the epitaxially-grown semiconductor material can have a lattice constant substantially close to (e.g., lattice mismatch within 5%) that of the material of substrate 106. In some embodiments, the epitaxially-grown semiconductor material can include: (i) a semiconductor material, such as Ge or Si; (ii) a compound semiconductor material, such as GaAs and/or AlGaAs; or (iii) a semiconductor alloy, such as SiGe and/or GaAsP. S/D region 110 can be doped with p-type dopants or doped with n-type dopants. The p-type dopants can include B, In, Al, or Ga. The n-type dopants can include P or As. In some embodiments, S/D region 110 can have multiple sub-regions (not shown) that may include SiGe and may differ from each other based on, for example, doping concentration, epitaxial growth process conditions, and/or relative concentration of Ge with respect to Si. For example, the atomic percent Ge in the sub-region closest to stacked fin portion 108B can be smaller than the atomic percent Ge in the sub-region farthest from stacked fin portion 108B.

Channel layer 122 can include semiconductor materials similar to substrate 106. For example, channel layer 122 can include a semiconductor material having lattice constant substantially close to (e.g., lattice mismatch within 5%) that of substrate 106. In some embodiments, channel layer 122 can include Si or SiGe. In some embodiments, channel layer 122 can include SiGe with a Ge concentration from about 25 atomic percent to about 50 atomic percent with any remaining atomic percent being Si or can include Si without any substantial amount of Ge. In some embodiments, channel layer 122 and substrate 106 can include semiconductor materials with oxidation rates and/or etch selectivity different from each other. Channel layer 122 can be undoped, doped with p-type dopants or doped with n-type dopants. The p-type dopant can include B, In, Al, or Ga. The n-type dopant can include P or As.

Gate structure 112 can be multi-layered structures that wraps around portions of one or more fin structures 108. For example, gate structure 112 can wrap FET 102's channel layers 122 (e.g., semiconductor layer 122) to modulate a conductivity of FET 102's channel layer 122. In some embodiments, gate structure 112 can be referred to as gate-all-around (GAA) structures, where FET 102 can be referred to as a GAA FET 102. Gate structure 112 can include an oxide layer 112A, a gate dielectric layer 112B disposed on oxide layer 112A, a gate electrode 112C disposed on dielectric layer 112B, and gate spacers 114 disposed on sidewalls of gate electrode 112C. Oxide layer 112A and gate dielectric layer 112B can be wrapped around each of channel layers 122, hence electrically isolating channel layers 122 from each other and from gate electrode 112C. Oxide layer 112A and gate dielectric layer 112B can be disposed between gate electrode 112C and S/D regions 110 to prevent electrical shorting in between.

Oxide layer 112A can be an interfacial dielectric layer sandwiched between each channel layer 122 and gate dielectric layer 112B. In some embodiments, oxide layer 112A can include a semiconductor oxide material (e.g., silicon oxide or silicon germanium oxide) and can have a thickness ranging from about 1 nm to about 10 nm.

Gate dielectric layer 112B can include silicon oxide and can be formed by chemical vapor deposition (CVD), atomic layer deposition (ALD), physical vapor deposition (PVD), e-beam evaporation, or other suitable processes. In some embodiments, gate dielectric layer 112B can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, gate dielectric layer 112B can include a single layer or a stack of insulating material layers. Gate dielectric layer 112B can have a thickness ranging from about 1 nm to about 5 nm. Other materials and formation methods for gate dielectric layers 112B are within the spirit and scope of this disclosure.

Gate electrode 112C can be configured as gate terminal of FET 102. Gate electrode 112C can include metal stacks wrapping about each of channel layers 122. Depending on the spaces between adjacent channel layers 122 and the thicknesses of the layers of gate structures 112, each channel layers 122 can be wrapped around by one or more layers of gate electrodes 112C filling the spaces between adjacent channel layers 122. In some embodiments, gate electrode 112C can include a gate barrier layer (not shown in FIGS. 1A and 1B), a gate work function layer (not shown in FIGS. 1A and 1B), and a gate metal fill layer (not shown in FIGS. 1A and 1B). The gate barrier layer can serve as a nucleation layer for subsequent formation of a gate work function layer. The gate barrier layer can further prevent substantial diffusion of metals (e.g., aluminum) from the gate work function layer to underlying layers (e.g., gate dielectric layers 112B or oxide layers 112A). The gate barrier layer can include titanium (Ti), tantalum (Ta), titanium nitride (TiN), tantalum nitride (TaN), or other suitable diffusion barrier materials. The gate work function layer can include a single metal layer or a stack of metal layers. The stack of metal layers can include metals having work function values equal to or different from each other. In some embodiments, the gate work function layer can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, the gate work function layer can include Al-doped metal, such as Al-doped Ti, Al-doped TiN, Al-doped Ta, or Al-doped TaN. Gate metal fill layer can include a single metal layer or a stack of metal layers. The stack of metal layers can include metals different from each other. In some embodiments, the gate metal fill layer can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Other materials for the gate barrier layer, the gate work function layer, and the gate metal fill layer are within the spirit and scope of this disclosure.

Gate structure 112 can further include a gate spacer 114 in physical contact with oxide layers 112A and gate dielectric layers 112B. Gate spacer 114 can have a low-k material with a dielectric constant less than about 3.9. For example, gate spacer 114 can include insulating material, such as silicon oxide, silicon nitride, a low-k material, or a combination thereof. In some embodiments, gate spacer 114 can have a thickness ranging from about 2 nm to about 10 nm. Other materials and thicknesses for gate spacer 114 are within the spirit and scope of this disclosure.

In some embodiments, as shown in FIG. 1C, gate structure 112 can further include an inner spacer 172 disposed between gate structure 112 and S/D region 110. For example, inner spacer 172 can be in contact with gate dielectric layers 112B and/or oxide layers 112A, according to some embodiments. In some embodiments, inner spacer 172 can be disposed between each vertically (in the z-direction) adjacent channel layers 122. Inner spacer 172 can have a low-k material with a dielectric constant less than about 3.9. For example, inner spacer 172 can include insulating material, such as silicon oxide, silicon nitride, a low-k material, or a combination thereof. In some embodiments, inner spacer 172 can have a thickness ranging from about 2 nm to about 10 nm. Other materials and thicknesses for inner spacers 172 are within the spirit and scope of this disclosure.

S/D contact 124 can be formed over S/D region 110 to electrically connect the underlying S/D region 110 to other elements of the integrated circuit (not shown in FIGS. 1A and 1B). S/D contact 124 can include a silicide layer and a conductive region over the silicide layer (not shown in FIGS. 1A and 1B). The silicide layer can include metal silicide and can provide a low resistance interface between the conductive regions and the underlying S/D region 110. Examples of metal used for forming the metal silicide can be Co, Ti, and Ni. The conductive region can include conductive materials, such as W, Al, and Co. The conductive region can have an average horizontal dimension (e.g., width in the x-direction) in a range from about 15 nm to about 25 nm and can have an average vertical dimension (e.g., height in the z-direction) in a range from about 400 nm to about 600 nm. In some embodiments, at least one conductive liner (not shown) can be disposed between the silicide layer and the conductive region. The conductive liner can be configured as a diffusion barrier and can include a single layer or a stack of conductive materials, such as TiN, Ti, Ni, TaN, Ta, or a combination thereof. In some embodiments, the conductive liner can act as an adhesion-promoting-layer, a glue-layer, a primer-layer, a protective-layer, and/or a nucleation-layer. The conductive liner can have a thickness in a range from about 1 nm to about 2 nm, according to some embodiments. Based on the disclosure herein, other materials and dimensions for the conductive liner, the silicide layer, and the conductive region are within the spirit and scope of this disclosure.

Referring to FIGS. 1A and 1B, each FET 102 can further include a S/D padding layer 126, a gate padding layer 128, and interlayer dielectric (ILD) layer 118. S/D padding layer 126 can be respectively disposed over S/D contact 126 to provide an electrical insulation between S/D contact 124 and interconnect structure 140. Similarly, gate padding layer 128 can be disposed over gate structure 112 to provide an electrical insulation between gate structure 112 and interconnect structure 140. Both S/D padding layer 126 and gate padding layer 128 can be made of any suitable insulating material. By way of example and not limitation, S/D padding layer 126 and gate padding layer 128 can be made of silicon carbide, lanthanum oxide, aluminum oxide, aluminum oxynitride, zirconium oxide, hafnium oxide, silicon nitride, silicon, zinc oxide, zirconium nitride, zirconium aluminum oxide, titanium oxide, tantalum oxide, yttrium oxide, tantalum carbide nitride, zirconium silicide, silicon oxynitride carbide, silicon oxycarbide, silicon carbonnitride, hafnium silicide, silicon oxide, or combination thereof.

ILD layer 118 can be disposed over fin structure 108 to provide an electrical insulation between fin structure 108 and interconnect structure 140. In some embodiments, ILD layer 118 can further encapsulate S/D padding layer 126, gate padding layer 128, and S/D contact 124. ILD layer 118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD layer 118 can further include an etch stop liner (not shown in FIGS. 1A and 1B) adjacent to gate structure 112 and/or S/D region 110. By way of example and not limitation, the etch stop liner can include silicon nitride, silicon oxide, silicon oxynitride, silicon carbide, silicon carbo-nitride, boron nitride, silicon boron nitride, silicon carbon boron nitride, or a combination thereof. In some embodiments, ILD layer 118 can have a thickness from about 50 nm to about 200 nm. Other materials, thicknesses, and formation methods for ILD layer 118 are within the spirit and scope of this disclosure.

In some embodiments, FET 102 can further include a trench conductor layer 130 formed over S/D contact 124 and/or gate structure 112. For example, as shown in FIG. 1B, trench conductor layer 130 can be embedded in S/D padding layer 126 and in contact with the underlying S/D contact 124. Therefore, trench conductor layer 130 can electrically bridge interconnect structure 140 and the underlying S/D contact 124. In some embodiments, trench conductor layer 130 can be embedded in gate padding layer 128 and in contact with gate electrode 112C, where trench conductor layer 130 can electrically bridge interconnect structure 140 and the underlying gate electrode 112C (this embodiment is not shown in FIGS. 1A and 1B). Trench conductor layer 130 can be made of any suitable conductive materials, such as W, Al, Cu, Co, Ti, Ta, Ru, Mo, a silicide material, and a conductive nitride material. Trench conductor layer 130 can have an average horizontal dimension (e.g., width in the x-direction) and an average vertical dimension (e.g., height in the z-direction) based on a pitch size of FET 102. For example, trench conductor layer 130 can have an average horizontal dimension (e.g., width in the x-direction) in a range from about 15 nm to about 25 nm and can have an average vertical dimension (e.g., height in the z-direction) in a range from about 400 nm to about 600 nm. Based on the disclosure herein, other materials and dimensions for trench conductor layer 130 are within the spirit and scope of this disclosure.

Interconnect structure 140 can include multiple interconnect layers disposed over FETs 102. For example, referring to FIG. 1B, interconnect structure 140 can include a first interconnect layer $140_1$ disposed over and in contact with FETs 102, and a second interconnect layer $140_2$ disposed over and in contact with first interconnect layer $140_1$. First interconnect layer $140_1$ can include a layer of insulating material 142 selectively disposed over dielectric top surfaces of FETs 102 and selectively opened to underlying FET 102's metallic top surfaces. For example, as shown in FIG. 1B, layer of insulating material 142 can be selectively disposed over S/D padding layer 126 and gate padding layer 128 while having a via opened to underlying FET 102's trench conductor layer 130. In some embodiments, layer of insulating material 142 can also be selectively disposed over gate spacer 114 and having an via opened to underlying FET 102's trench conductor layer 130, while gate spacer 114, S/D padding layer 126 and gate padding layer 128 can be coplanar with each other (this embodiment is not shown in FIGS. 1A-1D). First interconnect layer $140_1$ can also include a layer of conductive material 146 disposed over layer of insulating material 142. Since layer of insulating material 142 can be selectively disposed over S/D padding layer 126, layer of conductive material 146 can be further separated from portions of S/D contact 124 buried under S/D padding layer 126 by layer of insulating material 142. Similarly, layer of conductive material 146 can be further separated from portions of gate electrode 112C buried under gate padding layer 128 by layer of insulating material 142. By further separating layer of conductive material 146 from its underlying S/D contact 124 and/or gate electrode 112C, layer of insulating material 142 can reduce TDDB failure between interconnect structure 140 and FET 102. In some embodiments, layer of insulating material 142's thickness $H_{142}$ can range from about from about 0.5 nm to about 50 nm. Insulating material 142 with thickness $H_{142}$ less than about 0.5 nm may not provide sufficient enhancement of dielectric breakdown voltage, according to some embodiments. On the contrary, insulating material 142 with thickness $H_{142}$ greater than about 50 nm may result in poor gap filling for the gap filling material (e.g. layer of conductive material 146) being filled in the via (e.g., via 601; discuss below) formed through layer of insulating material 142, according to some embodiments. In some embodiments, an aspect ratio of thickness $H_{142}$ to trench conductor layer 130's horizontal (e.g., in the x-direction) dimension $W_{130}$ can be less than about 50, less than about 20, less than about 15, less than about 10, or less than about 5. An aspect ratio higher than the above noted thresholds may result in poor gap filling for the gap filling material (e.g. layer of conductive material 146) being filled in the via (e.g., via 601) formed through layer of insulating material 142, according to some embodiments. Other thicknesses of $H_{142}$ are within the spirit and scope of this disclosure. In some embodiments, layer of conductive material 146 can be formed through the via in layer of insulating material 142 and in contact with trench conductor layer 130. For example, FIG. 1B exhibits layer of insulating material 142 having the via opened to the underlying trench conductor layer 130, where layer of conductive material 146 can be in contact with trench conductor layer 130 through the layer of insulating material 142's via. In some embodiments, first interconnect layer 140₁ can further include a back end of line (BEOL) stack 144 configured to electrically isolate a layer of conductive material 146 from another layer of conductive material 146 (not shown in FIG. 1B) in first interconnect layer 140₁. For example, BEOL stack 144 can be disposed laterally adjacent to layer of conductive material 146 and over portions of layer of insulating material 142. In some embodiments, BEOL stack 144 can be coplanar with layer of conductive material 146. In some embodiments, BEOL stack 144 can include a first BEOL etch stop layer (ESL) 144A, a second BEOL ESL 144B, and BEOL ILD layer 144C, where first BEOL etch stop layer (ESL) 144A, second BEOL ESL 144B, and BEOL ILD layer 144C can have different etching selectivity from each other. In some embodiments, each of BEOL ESL 144A, BEOL ESL 144B, and BEOL ILD layer 144C can range from about 1 nm to about 30 nm. Other thicknesses for each of BEOL ESL 144A, BEOL ESL 144B, and BEOL ILD layer 144C are within the spirit and scope of this disclosure. Second interconnect layer 140₂ can include a layer of conductive material 164 and a layer of insulating material 148 disposed over between layer of conductive material 164 and first interconnect layer 140₁. For example, layer of insulating material 148 can be disposed over a layer of conductive material 146 to separate layer of conductive material 164 from layer of conductive material 146. In some embodiments, layer of conductive material 164 can also be disposed over first interconnect layer 140₁'s BEOL stack 144. Second interconnect layer 140₂ can further include a trench conductor layer 162 formed through layer of insulating material 148. Trench conductor layer 162 can be configured to electrically connect first interconnect layer 140₁ and second interconnect layer 140₂. For example, trench conductor layer 162 can be in contact with and electrically bridge both interconnect layer of conductive material 164 from layer of conductive material 146. In some embodiments, trench conductor layer 162's sidewall can be slanting to substrate 106.

In some embodiments, interconnect structure 140 can further include one or more interconnect layers (not shown in FIG. 1B) disposed over interconnect layer 140₂, where each of the one or more interconnect layers can have an identical or substantially similar structure as second interconnect layer 140₂. For example, each of the one or more interconnect layers can include layer of conductive material 164, layer of insulating material 148 disposed under layer of conductive layer material 164, and trench conductor layer 162 formed within layer of insulating material 148 and configured to electrically bridge vertically (e.g., in the z-direction) adjacent interconnect layers.

In some embodiments, each of layer of insulating material 142 and BEOL stack 144 can include any suitable dielectric material, such as silicon carbide, lanthanum oxide, aluminum oxide, aluminum oxynitride, zirconium oxide, hafnium oxide, silicon nitride, silicon, zinc oxide, zirconium nitride, zirconium aluminum oxide, titanium oxide, tantalum oxide, yttrium oxide, tantalum carbide nitride, zirconium silicide, silicon oxynitride carbide, silicon oxycarbide, silicon carbonnitride, hafnium silicide, silicon oxide, or combination thereof. In some embodiments, each of layer of conductive material 146, layer of conductive material 164 and trench conductor layer 162 can include any suitable conductive material, such as W, Al, Cu, Co, Ti, Ta, Ru, Mo, a silicide material, and a conductive nitride material. Other materials for layer of insulating material 142, BEOL stack 144, layer of conductive material 146, layer of conductive material 164, and trench conductor layer 162 are within the spirit and scope of this disclosure.

FIG. 1D exhibits a zoom-in cross-sectional view of FIG. 1B's area 131. As shown in FIG. 1D, layer of insulating material 142 can include a top surface 145 in contact with layer of conductive material 146, a bottom surface 141 in contact with dielectric top surfaces of FET 102 (e.g., S/D padding layer 126's top surface and/or gate padding layer 128's top surface), and a sidewall 143. In some embodiments, layer of insulating material 142 can further include an upper shoulder structure 152 that can connect top surface 145 and sidewall 143 by tapering from sidewall 143 to top surface 145. For example, upper shoulder structure 152 can have a warped surface, a curved surface or a rounded surface that tapers from an end 151 on sidewall 143 toward an end 153 on top surface 145. Such warped, curved or rounded surface of upper shoulder structure 152 can enhance the gap-fill of layer of conductive material 146 in the via formed in layer of insulating material 142 to contact the underlying trench conductor layer 130. Upper shoulder structure 152 can have a vertical (e.g., in the z-direction) displacement $H_{152}$ and a horizontal (e.g., in the x-direction) displacement $W_{152}$ determined by the growth process associated with layer of insulating material 142 and/or the etching process associated with the patterning of BEOL stack 144. In some embodiments, vertical (e.g., in the z-direction) displacement $H_{152}$ between end 151 and end 153 can be between about 0.1 nm and about 10 nm. Such lower bound of vertical (e.g., in the z-direction) displacement $H_{152}$'s range can ensure a reliable gap-fill of layer of conductive material 146 in the via formed in layer of insulating material 142. In some embodiments, horizontal (e.g., in the x-direction) displacement $W_{152}$ between end 151 and end 153 can be between about 0.1 nm and about 10 nm. Such lower bound of horizontal (e.g., in the x-direction) displacement $W_{152}$'s range can ensure a reliable gap-fill of layer of conductive material 146 in the via formed in layer of insulating material 142. In some embodiments, layer of insulating material 142 can also include a lower shoulder structure 154 resulted from a lateral (e.g., in the x-direction) extension of layer of insulating material 142 during the growth of layer of insulating material 142. Lower shoulder structure 154 can connect bottom surface 141 and sidewall 143 by tapering from sidewall 143 to bottom surface 141. For example, lower shoulder structure 154 can have a warped surface, a curved surface, or a rounded surface that tapers from an end 157 on sidewall 143 towards an end 155 on bottom surface 141. Lower shoulder structure 154 can have a vertical (e.g., in the z-direction) displacement $H_{154}$ and a horizontal (e.g., in the x-direction) displacement $W_{154}$ determined by the lateral extension of layer of insulating material 142 during the growth of layer of insulating material 142. In some embodiments, vertical (e.g., in the z-direction) displacement $H_{154}$ between end 155 and end 157 can be between about 0.1 nm and about 10 nm. Such upper bound of vertical (e.g., in the z-direction) displacement $H_{154}$'s range can ensure a reliable gap-fill of layer of conductive material 146 in the via formed in layer of insulating material 142. In some embodiments, horizontal (e.g., in the x-direction) displacement $W_{154}$ between end 155 and end 157 can be between about 0.1 nm and about 10 nm. Such upper bound of horizontal (e.g., in the x-direction) displacement $W_{154}$'s range can ensure a reliable gap-fill of layer of conductive material 146 in the via formed in layer of insulating material 142. In some embodiments, layer of insulating material 142 can horizontally (e.g., in the x-direction) extend from FET 102's dielectric top surface towards FET 102's top metallic surface. For example, as shown in FIG. 1D, layer of insulating material 142 can be extended over an edge portion of trench conductor layer 130 and opened to a center portion of trench conductor layer 130. Layer of insulating material 142's bottom surface 141 can cover both FET 102's dielectric top surface (e.g., S/D padding layer 126's top surface and/or gate padding layer 128's top surface) and the edge portion of trench conductor layer 130's top surface. Namely, end 155 that is adjacent to lower shoulder structure 154 can be disposed over the edge portion of trench conductor layer 130. For example, layer of insulating material 142 can have a horizontal (e.g., in the x-direction) extension $EXT_{155}$ between end 155 and FET 102's dielectric surface (e.g., S/D padding layer 162) can be between about 0.1 nm and about 10 nm. Such upper bound of horizontal (e.g., in the x-direction) extension $EXT_{155}$'s range can ensure a reliable gap-fill of layer of conductive material 146 in the via formed in layer of insulating material 142. In some embodiments, layer of insulating material 142 can extend through an edge portion of trench conductor layer 130, where a line extending through end 151 and end 157 can extend through trench conductor layer 130's top surface.

In some embodiments, layer of insulating material 142's sidewall 143 can include a flat surface substantially perpendicular to substrate 106's top surface, S/D contact 124's top surface, gate electrode 112C's top surface, and/or trench conductor layer 130's top surface. For example, a line extending through end 151 and end 157 can be substantially perpendicular to substrate 106's top surface, S/D contact 124's top surface, gate electrode 112C's top surface and/or trench conductor layer 130's top surface. In some embodiments, layer of insulating material 142's sidewall 143 can include a warped surface, a curved surface, or a rounded surface (not shown in FIG. 1D). In some embodiments, layer of insulating material 142's sidewall 143 can include a flat surface slating to substrate 106, S/D contact 124, gate electrode 112C, and/or trench conductor layer 130. For example, a line extending through end 151 and end 157 can be slanted to substrate 106's top surface, S/D contact 124's top surface, gate electrode 112C's top surface, and/or trench conductor layer 130's top surface at an angle between about 45 degrees to about 135 degrees.

As previously discussed, layer of conductive material 146 can be formed through layer of insulating material 142's via and in contact with trench conductor layer 130. Referring to FIG. 1D, layer of conductive material 146 can be in contact with trench conductor layer 130 through layer of insulating material 142's via that has sidewalls 143 at opposite sides of the layer of insulating material 142's via. In some embodiments, layer of conductive material 146 can further include footing structures 147 at opposite sides of layer of insulating material 142's via. For example, as shown in FIG. 1D, each footing structure 147 can stand on trench conductor layer 130's top surface and can have a slanted surface tapered from layer of conductive material 146's edge towards layer of conductive material 146's central region. Each footing structure 147 can be adjacent to and substantially conformal to layers of insulating material 142. In some embodiments, each footing structures 147 can be sandwiched by layer of insulating material 142 and trench conductor layer 130. For example, footing structure 147 can be disposed under layer of insulating material 142's sidewall 143 and over trench conductor layer 130. In some embodiments, footing structures 147 can be sandwiched by layer of insulating material 142 and FET 102's dielectric top surface (e.g., S/D padding layer 126's top surface and/or gate padding layer 128's top surface). In some embodiments, each footing structure 147 can have a horizontal (e.g., in the x-direction) dimension and a vertical (e.g., in the z-direction) dimension respectively and substantially identical to lower shoulder structure 154's horizontal displacement $W_{154}$ and lower shoulder structure 154's vertical displacement $H_{154}$.

In some embodiments, layer of conductive material 146 can include a liner layer 146A and a metal layer 146B. As shown in FIG. 1D, footing structure 147 can include liner layer 146A. In some embodiments, footing structures 147 can also include portions of metal layer 146B. In some embodiments, trench conductor layer 130 can have a liner layer 130A and a metal layer 130B. By way of example and not limitation, each of the liner layer 130A, metal layer 130B, liner layer 146A and metal layer 146B can include any suitable conductive material, such as W, Al, Cu, Co, Ti, Ta, Ru, Mo, a silicide material (e.g., titanium silicide, cobalt silicide or nickel silicide), a conductive nitride material (e.g., titanium nitride or tantalum nitride), or a combination thereof. Based on the disclosure herein, other materials for liner layer 130A, metal layer 130B, liner layer 146A and metal layer 146B are within the spirit and scope of this disclosure.

In some embodiments, referring to FIG. 1E, liner layer 130A and metal layer 130B can be multilayer structures. For example, liner layer 130A can include a lower liner layer 130A$_1$ and an upper liner layer 130A$_2$ formed over lower liner layer 130A$_1$, and metal layer 130B can include a lower metal layer 130B$_1$ and an upper metal layer 130B$_2$ formed over lower metal 130B$_1$. Lower metal layer 130B$_1$ and upper metal layer 130B$_2$ can respectively protrude in lower liner layer 130A$_1$ and upper liner layer 130A$_2$. In some embodiments, upper liner layer 130A$_2$'s bottom surface can be sandwiched between lower metal layer 130B$_1$ and upper metal layer 130B$_2$. Each of lower liner layer 130A$_1$, upper liner layer 130A$_2$, lower metal layer 130B$_1$, and upper metal layer 130B$_2$ can include any suitable conductive material, such as W, Al, Cu, Co, Ti, Ta, Ru, Mo, a silicide material (e.g., titanium silicide, cobalt silicide or nickel silicide), a conductive nitride material (e.g., titanium nitride or tantalum nitride), or a combination thereof Based on the disclosure herein, other materials for lower liner layer 130A$_1$, upper liner layer 130A$_2$, lower metal layer 130B$_1$, and upper metal layer 130B$_2$ are within the spirit and scope of this disclosure.

In some embodiments, referring to FIG. 1F, BEOL stack 144 can be sandwiched between layer of insulating material 142 and S/D padding layer 126 and/or sandwiched between layer of insulating material 142 and gate padding layer 128. For example, BEOL stack 144 can include first BEOL ESL 144A and second BEOL ESL 144B, both formed over S/D padding layer 126 and gate padding layer 128. Accordingly, layer of insulating material 142 can be combined with BEOL stack 144 to enhance the separation between layer of conductive material 146 and the underlying S/D contact 124 and/or enhance the separation between layer of conductive material 146 and gate electrode 112C, thus reducing TDDB failure between interconnect structure 140 and FET 102. Layer of conductive material 146 can connect to underlying S/D contact 124 and/or gate electrode 112C through trench conductor layer 130. For example, trench conductor layer 130 can be formed through first BEOL ESL 144A, second BEOL ESL 144B, and S/D padding layer 126 to contact the underlying S/D contact 124. Layer of conductive material 146 can be formed through portions of layer of insulating material 142 that is vertically (e.g., in the z-direction) above trench conductor layer 130 to contact the underlying trench conductor layer 130. In some embodiments, trench conductor layer 130 can be formed through first BEOL ESL 144A, second BEOL ESL 144B, and gate padding layer 128 to contact the underlying gate electrode 112C. In some embodiments, trench conductor layer 130 can be substantially coplanar with BEOL stack 144.

Figure 2:
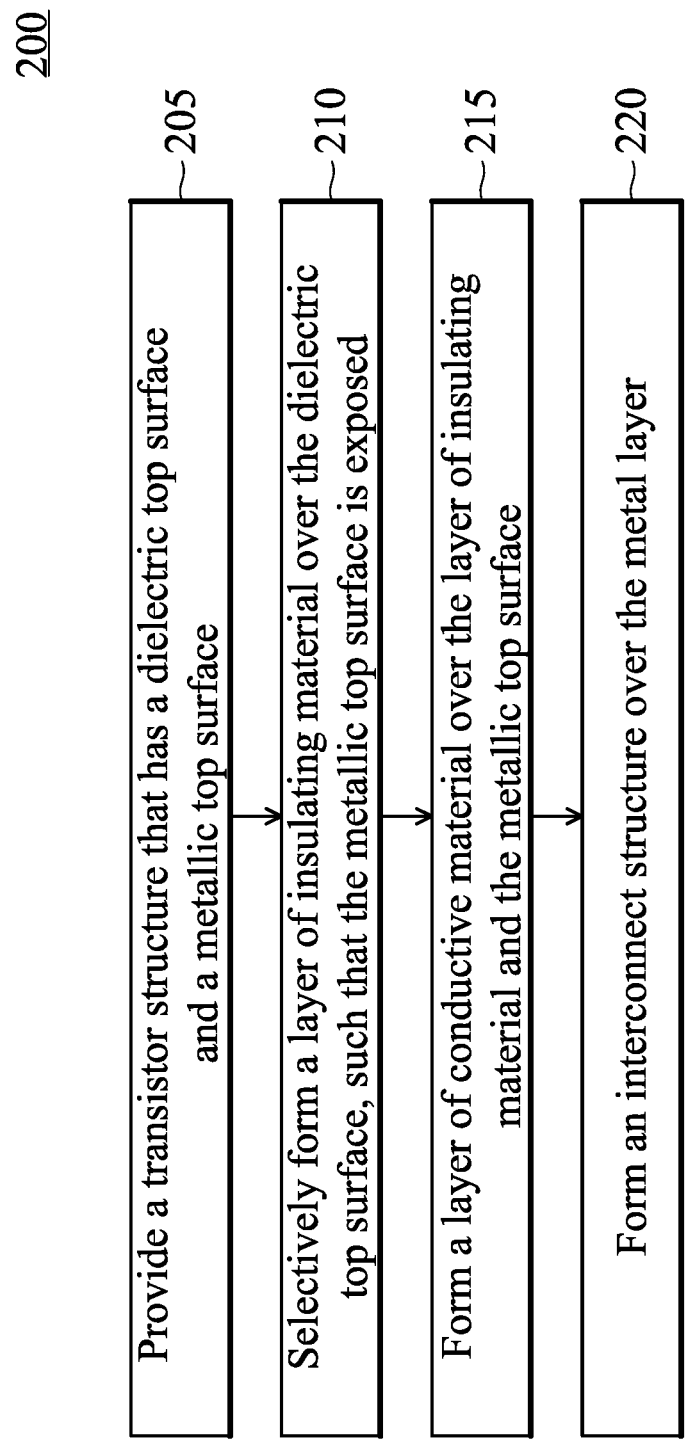
FIG. 2 is a flow diagram of a method for fabricating a semiconductor device, according to some embodiments.
Figure 3:
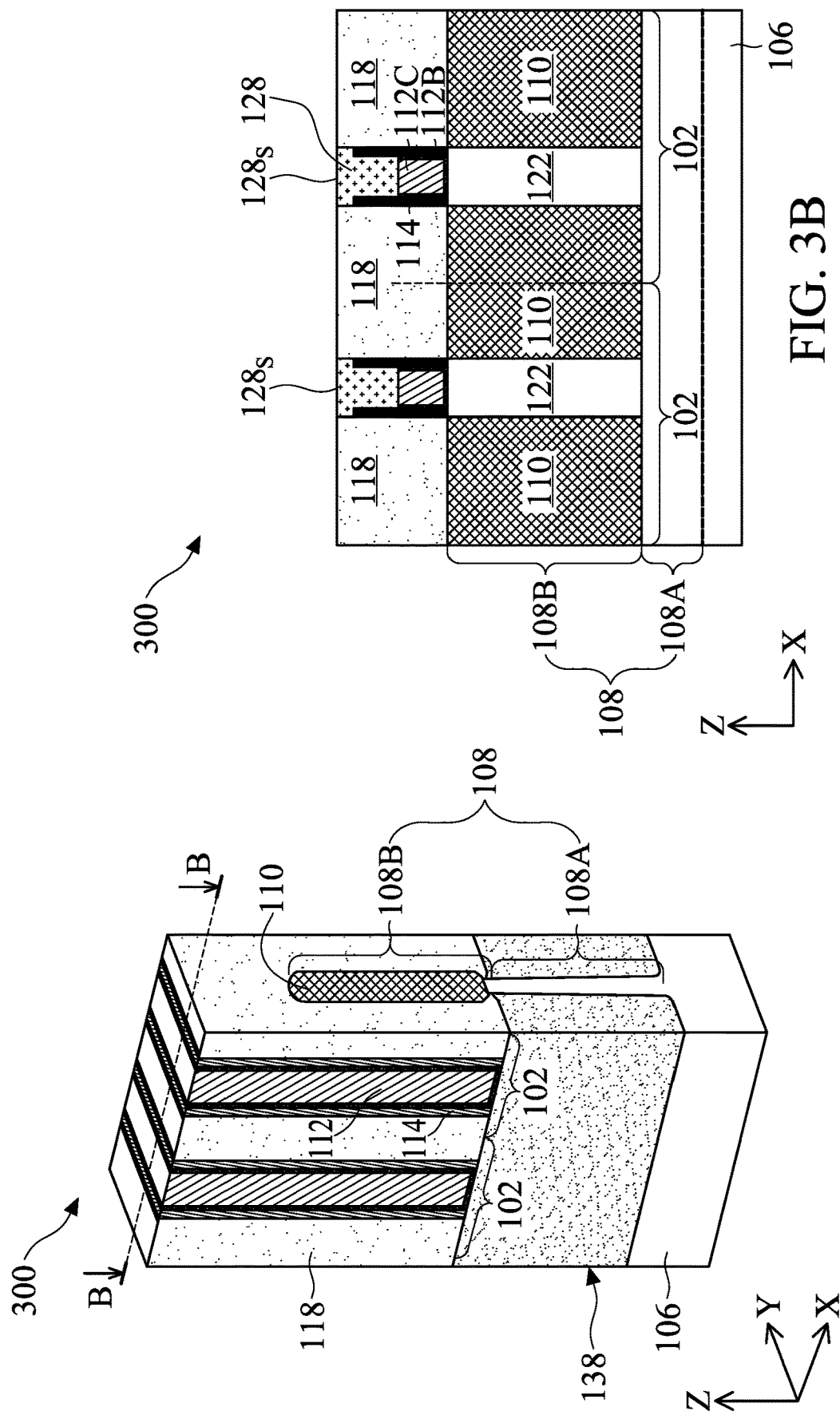
FIG. 3A illustrates an isometric view of a semiconductor device at a stage of its fabrication process, according to some embodiments.
FIGS. 3B, 4, 5A-5C, 6A-6C, and 7-9 illustrate cross-sectional views of a semiconductor device at various stages of its fabrication process, according to some embodiments.

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-3B, 4, 5A-5C, 6A-6C, and 7-9. FIG. 3A is an isometric view of semiconductor device 100 at various stages of its fabrication, according to some embodiments. FIGS. 3B, 4, 5A-5C, 6A-6C, and 7-9 are cross-sectional views along line B-B of FIG. 3A at various stages of its fabrication to form semiconductor device 100, according to some embodiments. Operations can be performed in a different order or not performed depending on specific applications. Method 200 may not produce a complete semiconductor device 100. Accordingly, it is understood that additional processes can be provided before, during, and after method 200, and that some other processes may only be briefly described herein. Further, the discussion of elements in FIGS. 1A-1F, 3A-3B, 4, 5A-5C, 6A-6C, and 7-9 with the same annotations applies to each other, unless mentioned otherwise.

Figure 5A:
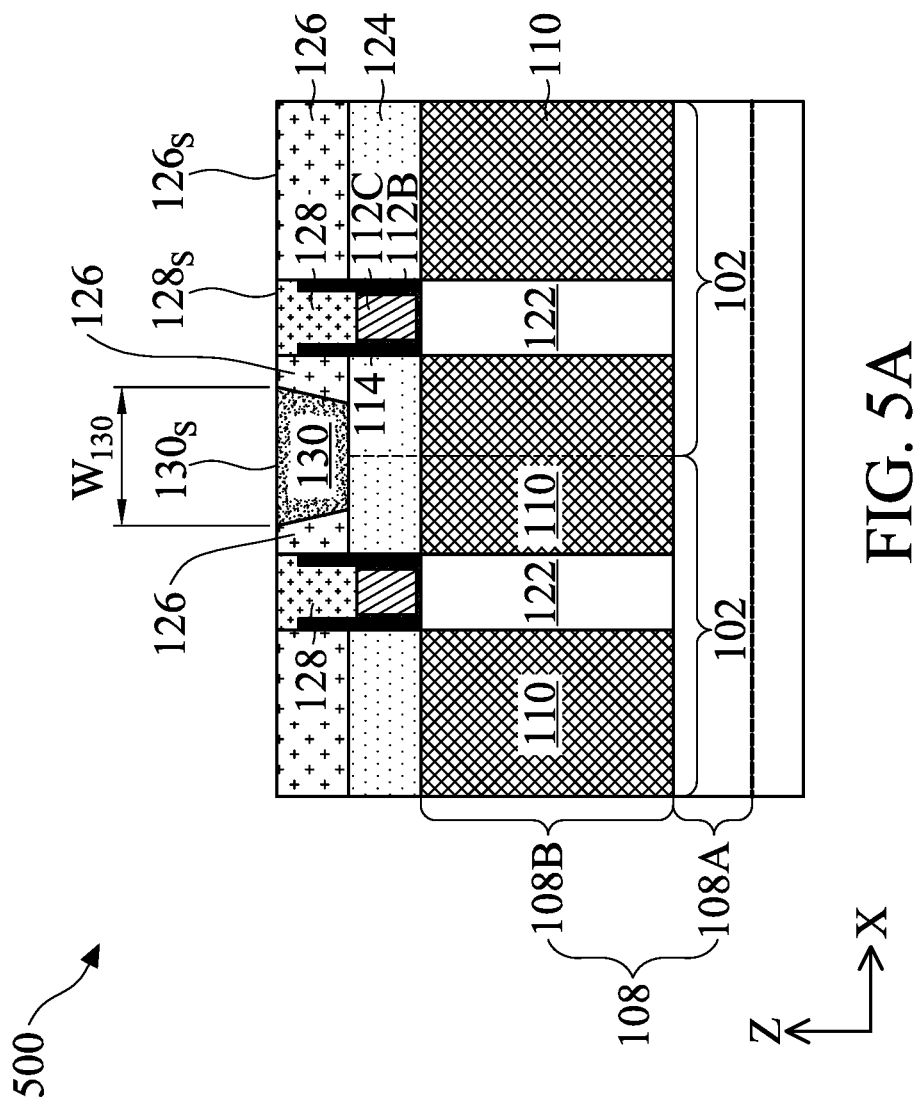

In operation 205, a transistor structure with a dielectric top surface and a metallic top surface is provided. For example, FIG. 5A shows a semiconductor device 500 with one or more FETs 102 having metallic top surface 130$_s$ and dielectric top surfaces 126$_s$ and 128$_s$. Operation 205 can begin with providing a semiconductor device 300 as shown in FIGS. 3A and 3B. Semiconductor device 300 can include fin structure 108 traversed by gate structures 112 and encapsulated by ILD layer 118. By way of example and not limitation, the formation of semiconductor device 300 can include forming fin structure 108 on substrate 106, forming STI region 138 adjacent to fin structure 108, forming gate structure 112 traversing through fin structure 108, forming ILD layer 118 over a portion of fin structure 108 not covered by gate structure 112, forming S/D regions 110, and forming gate padding layer 128 with a dielectric top surface 128$_s$ over gate structure 112. In some embodiments, as shown in FIG. 3B, forming fin structures 108 can include forming channel layers 122 in contact with substrate 106 (e.g., FETs 102 can become finFETs after the operations of method 200). In some embodiments, forming fin structures 108 can include one or more channel layers 122 separated from substrate 106 under gate structure 112 (e.g., FETs 102 can become GAA FETs after the operations of method 200). Other formation methods for semiconductor device 300 are within the spirit and scope of this disclosure.

Figure 4:
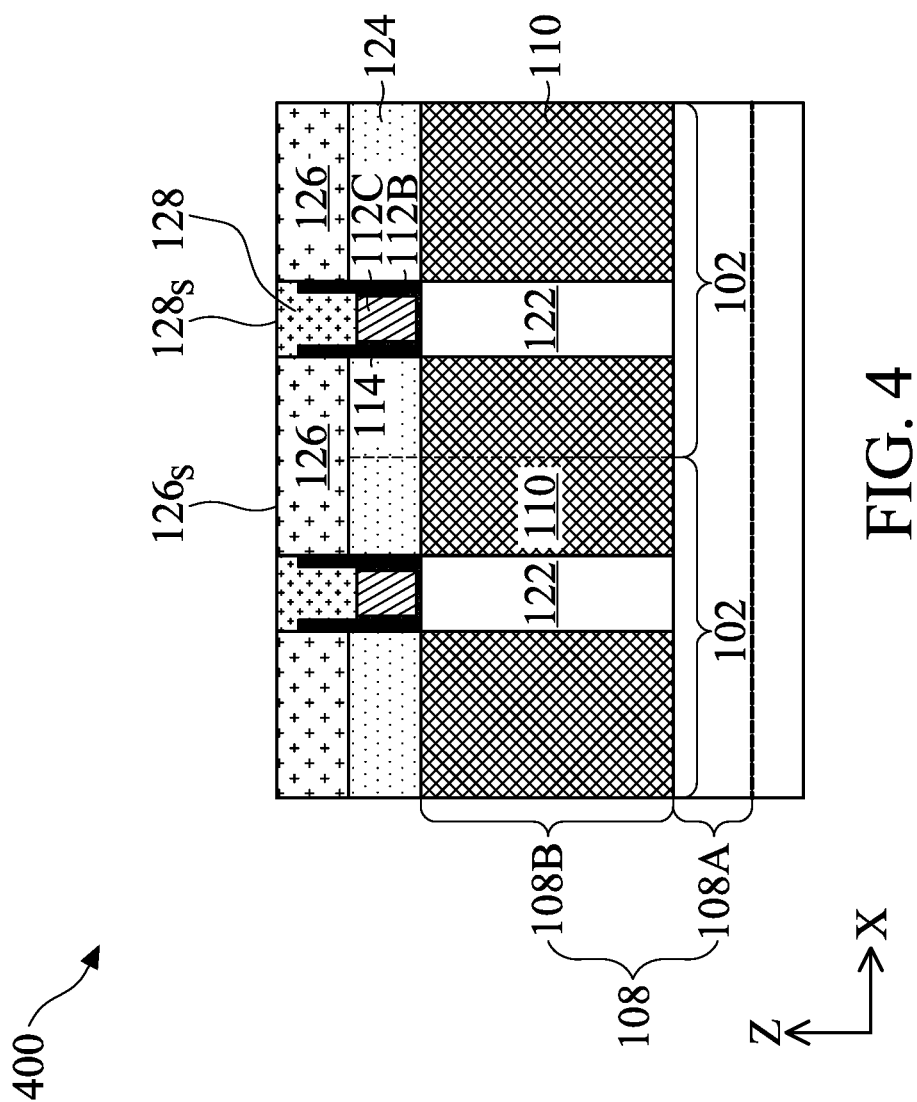

Further, in operation 205, S/D contact 124 and S/D padding layer 126 can be formed over semiconductor device 300 (shown in FIGS. 3A and 3B) to form semiconductor device 400 (shown in FIG. 4). By way of example and not limitation, a process of forming S/D contact 124 and S/D padding layer 126 can include forming an opening (not shown in FIG. 4) adjacent to gate structure 112 by removing portions of ILD layer 118, forming S/D contact 124 in the opening, depositing a dielectric material over S/D contact 124, and polishing the dielectric material to form S/D padding layer 126 that has a top surface 126$_g$. By way of example and not limitation, the process of forming S/D contact 124 can include depositing one or more conductive materials in the opening, polishing the deposited one or more conductive materials using a chemical mechanical polishing (CMP) process, etching back the polished one or more conductive materials to form S/D contact 124 using a dry etching or wet etching process. Other methods that form S/D contact 124 and S/D padding layer 126 are within the spirit and scope of this disclosure.

Further, in operation 205, trench conductor layer 130 can be formed over S/D contact 124. Referring to FIG. 5A, a process of forming trench conductor layer 130 over S/D contact 124 can include (i) forming an opening (not shown in FIG. 5A) in S/D padding layer 126 via a dry etching process (e.g., reactive ion etching) or a wet etching process to expose portions of S/D contact 124, (ii) blanket depositing one or more conductive materials in the opening and over S/D padding layer 126, and (iii) polishing the deposited one or more conductive materials using CMP to form trench conductor layer 130 that has a metallic top surface 130$_s$ substantially coplanar with S/D padding layer 126's top surface 126$_s$ and/or gate padding layer 128's top surface 128$_s$. In some embodiments, trench conductor layer 130's top surface 130$_s$ can have horizontal (e.g., in the x-direction) dimension W$_{130}$ ranging from about 2 nm to about 50 nm. In some embodiments, the blanket deposition of the one or more conductive materials can include depositing a layer liner material followed by depositing a layer of metal material, where the layer of liner material and the layer of metal material respectively form liner layer 130A (shown in FIG. 1D) and metal layer 130B (shown in FIG. 1D) after the subsequent polishing process.

Figure 5B:
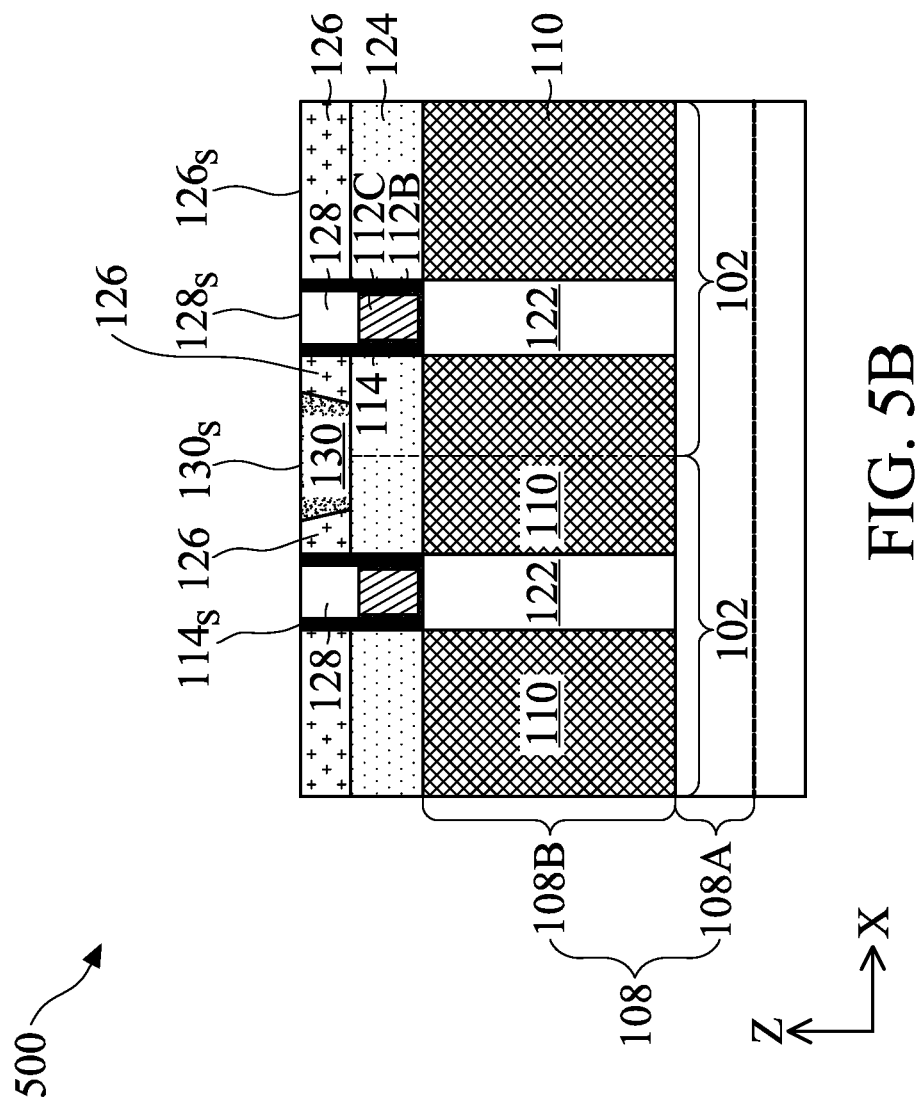

In some embodiments, referring to FIG. 5B, the polishing of the deposited one or more conductive materials can further coplanarize trench conductor layer 130's top surface 130$_s$, S/D padding layer 126's top surface 126$_s$, gate padding layer 128's top surface 128$_s$ with gate spacer 114's dielectric top surface 114$_s$.

Figure 5C:
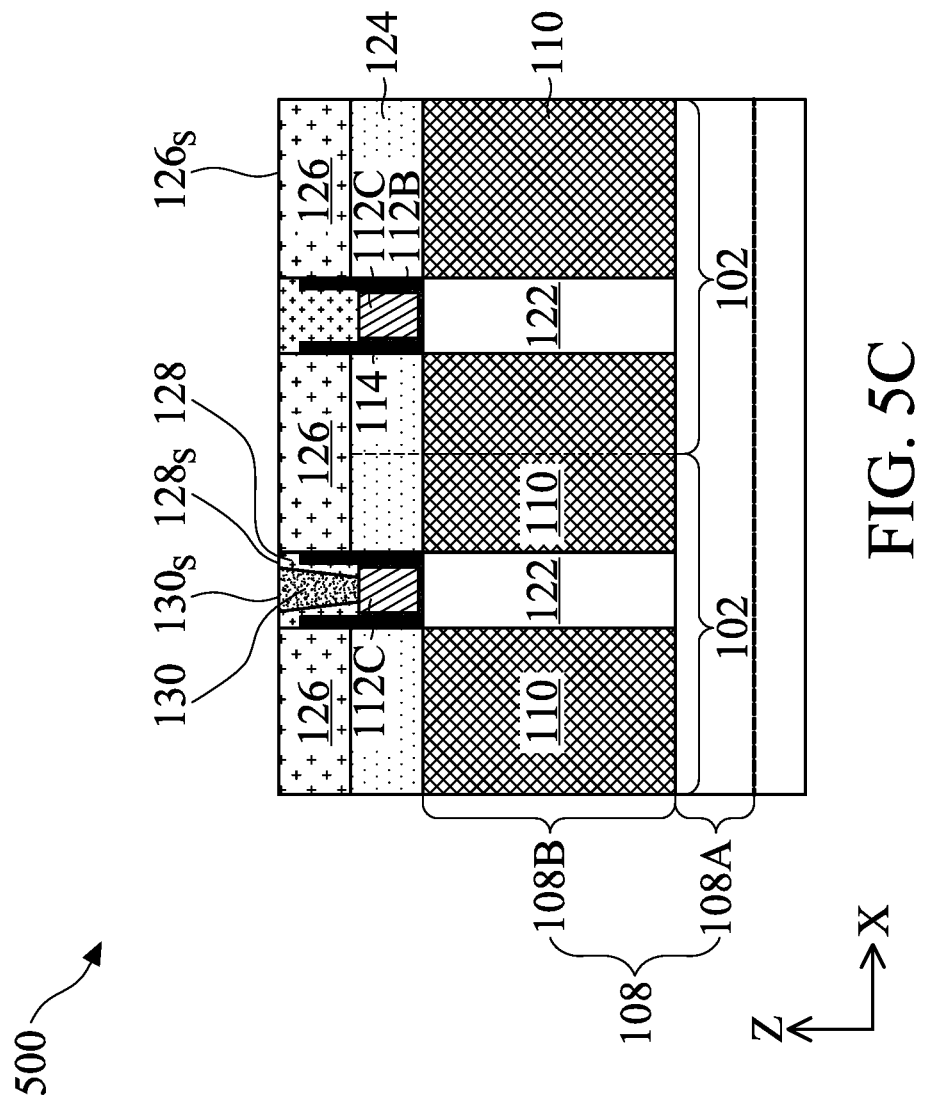

In some embodiments, referring to FIG. 5C, trench conductor layer 130 can be formed over gate electrode 112C. By way of example and not limitation, the process of forming trench conductor layer 130 over gate structure 112C can include (i) forming an opening (not shown in FIG. 5C) in gate padding layer 128 via a dry etching process (e.g., reactive ion etching) or a wet etching process to expose portions of gate electrode 112C, (ii) blanket depositing one or more conductive materials in the opening and over gate padding layer 128 using a deposition process, and (iii) polishing the deposited one or more conductive materials using CMP to form trench conductor layer 130 that has a metallic top surface $130_s$ substantially coplanar with S/D padding layer 126's top surface $126_s$ and/or gate padding layer 128's top surface $128_s$. By way of example and not limitation, the one or more conductive materials can include W, Al, Cu, Co, Ti, Ta, Ru, Mo, a silicide material (e.g., NiSi or CoSi), or a conductive nitride material (e.g., TiN or TaN), and can be deposited using CVD, ALD, PVD, e-beam evaporation, or other suitable processes.

Referring to FIG. 2, in operation 210, a layer of insulating material is selectively formed over dielectric top surface of the transistor structure such that metallic top surface $130_s$ is exposed. For example, as shown in FIG. 6C, layer of insulating material 142 is selectively formed over S/D padding layer 126's top surface $126_s$ and gate padding layer 128's top surface $128_s$ such that trench conductor layer 130's top surface $130_s$ is exposed. In some embodiments, a process of forming layer of insulating material 142 can include (i) forming a layer of inhibitor material 602 (shown in FIG. 6A) over metallic top surface $130_s$, (ii) blanket depositing one or more insulating materials over semiconductor device 600 of FIG. 6A to form layer of insulating material 142 with a via 601 (shown in FIG. 6B) opened to trench conductor layer 130, and (iii) removing the layer of inhibitor material 602 to expose trench conductor layer 130 (shown in FIG. 6C).

Figure 6A:
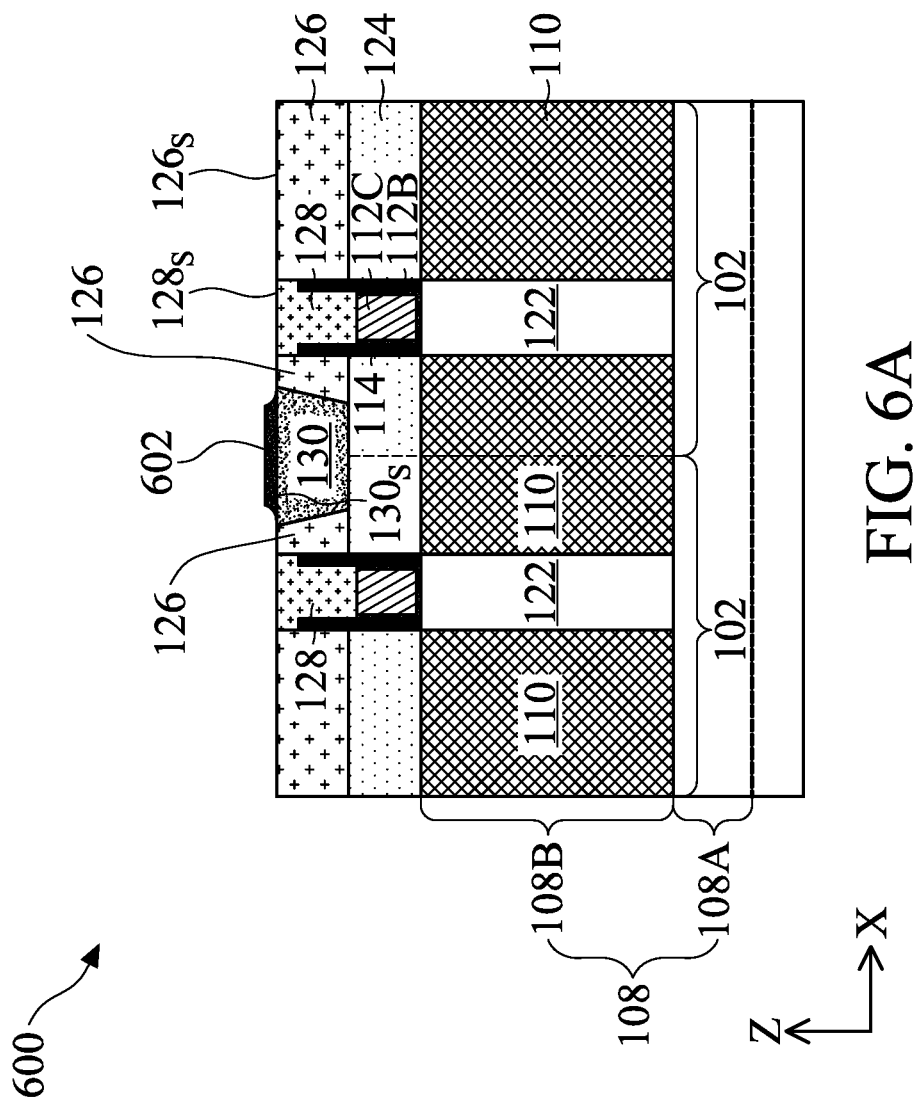

Referring to FIG. 6A, by way of example and not limitation, layer of inhibitor material 602 can include an oxide material, an organic material, a carbon-containing material, or an amphiphilic-like molecules such as an amphiphilic polymer molecule that can have both polar and non-polar bonds. Layer of inhibitor material 602 can be selectively grown on surfaces (e.g., top surface $130_s$) of metallic material, while exposing surfaces (e.g., top surface $126_s$ and/or top surface $128_s$) of insulating material. For example, layer of inhibitor material 602 can be a self-assembled-monolayer (SAM) material that can form one or more monolayers of molecules selectively on the metallic surfaces (e.g., top surface $130_s$) using a SAM process. By way of example and not limitation, the SAM process can be a spin-coating process, a liquid phase deposition process, or a vapor phase deposition process. As shown in FIG. 6A, layer of inhibitor material 602 can cover a central portion of the metallic surface (e.g., top surface $130_s$) while exposing an edge portion of the metallic surface. In some embodiments, layer of inhibitor material 602 can entirely cover the underlying metallic surface (e.g., top surface $130_s$). Other materials and formation methods for layer of inhibitor material 602 are within the spirit and scope of this disclosure.

Figure 6B:
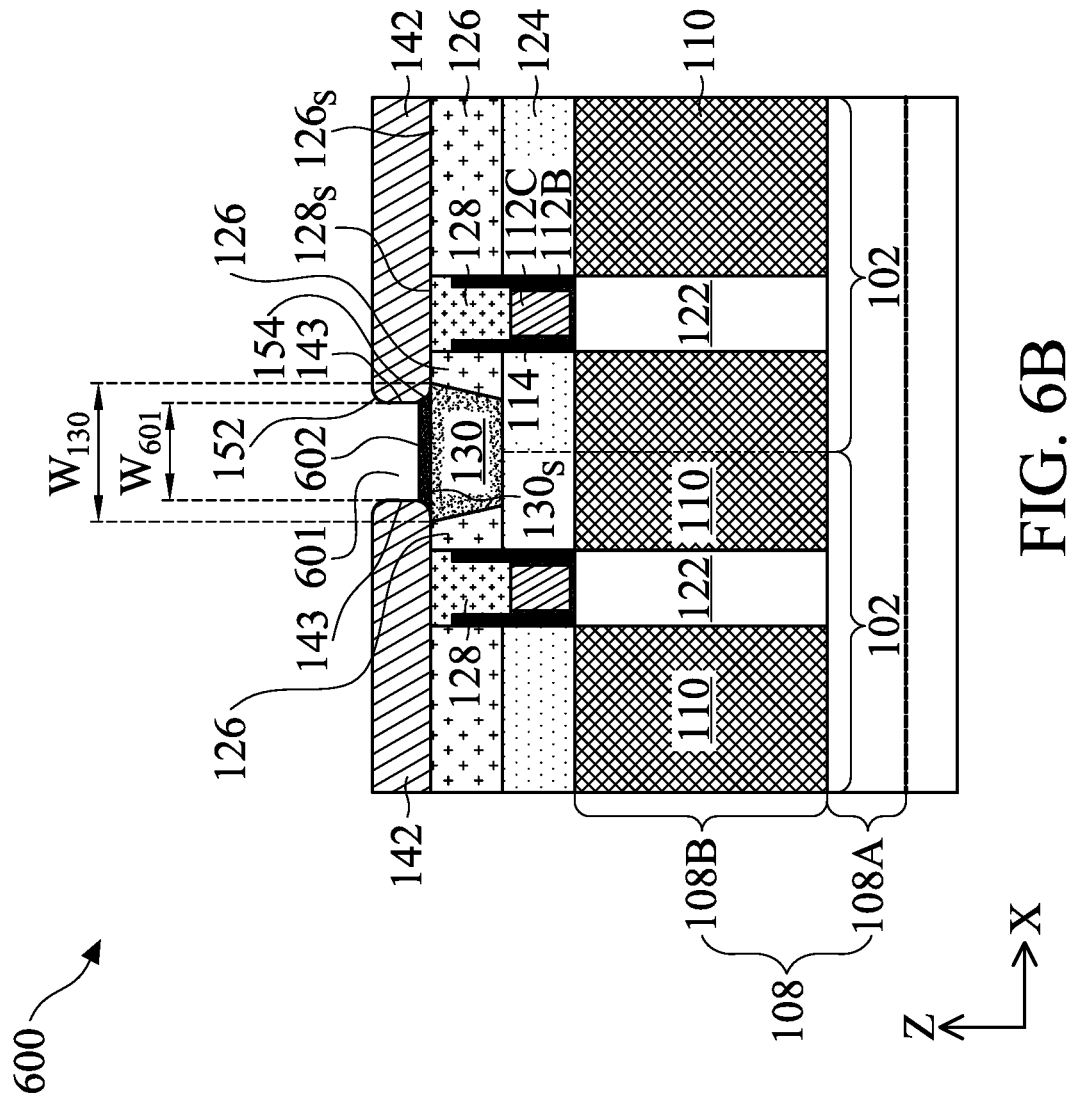
Figure 6C:
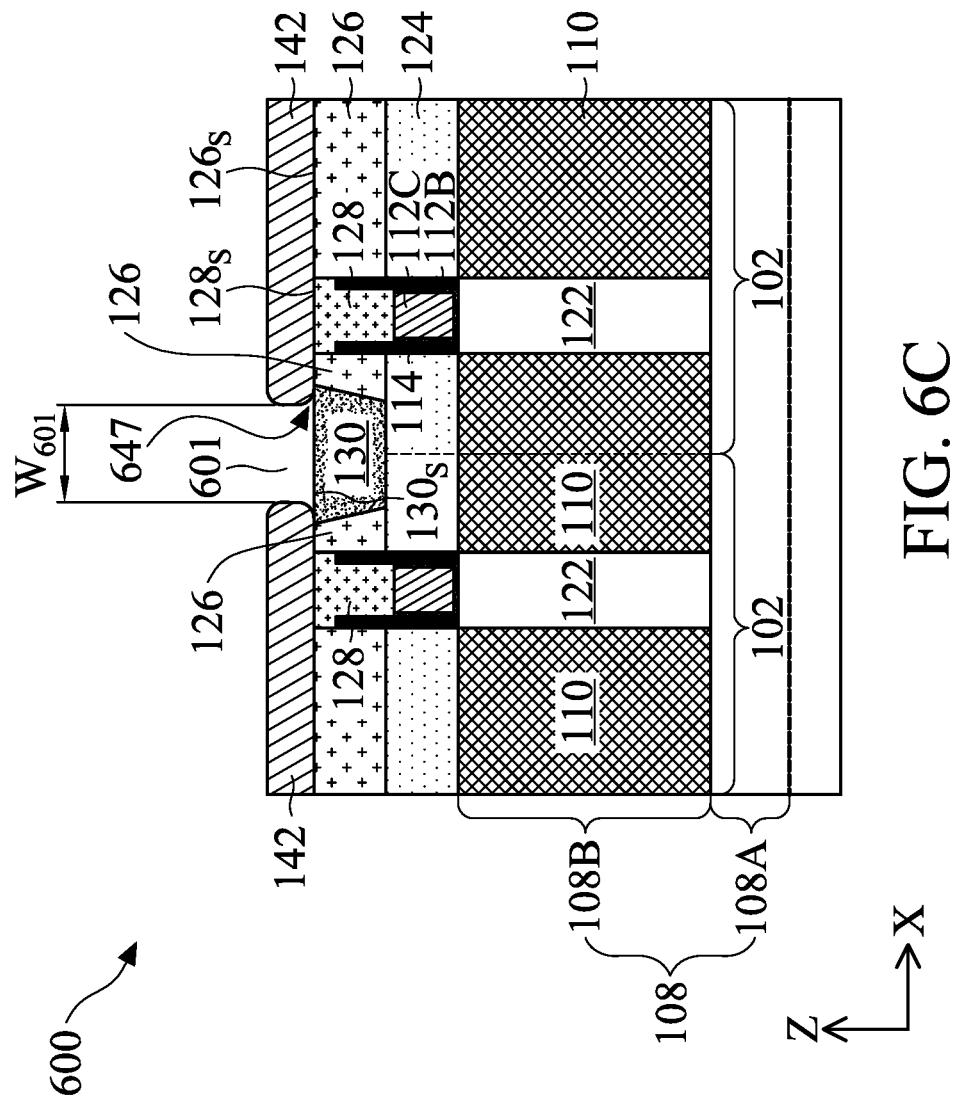

Referring to FIG. 6B, the blanket deposition of one or more insulating materials for forming layer of insulating material 142 can be conducted via a deposition process, while exposing layer of inhibitor material 602. By way of example and not limitation, the deposition process can include a chemical vapor deposition (CVD) process, a plasma enhanced chemical vapor deposition (PECVD) process, a physical vapor deposition (PVD) process, or an atomic layer deposition (ALD) process. In some embodiments, the deposition process can be configured to densify layer of insulating material 142. The densification of layer of insulating material 142 can enhance a breakdown voltage associated with layer of insulating material 142 to mitigate TDDB by reducing porosity and/or grain boundary in layer of insulating material 142. In some embodiments, the deposition process that can densify layer of insulating material 142 can be associated with a deposition temperature from about 300° C. to about 700° C., because such temperature range can enhance atomic bonding within layer of insulating material 142. In some embodiments, the deposition process that can densify layer of insulating material 142 can be associated with a deposition rate from about 0.5 Å/second to about 50 Å/second, because such deposition rate's range can both enhance atomic bonding in layer of insulating material 142 and meet the throughput requirement of fabricating semiconductor device 100.

Due to the existence of layer of inhibiting material 602, the deposition process can be delayed or inhibited on layer of inhibiting material 602, thus forming via 601 through layer of insulating material 142. Via 601 can be opened to layer of inhibiting material 602 and can expose layer of insulating material 142's sidewall 143. In some embodiments, via 601 can have a horizontal (e.g., in the x-direction) dimension $W_{601}$ ranging from about 2 nm to about 25 nm. In some embodiments, the deposition process can further include laterally (e.g., in the x-direction and/or the y-direction) growing layer of insulating material 142 over edge portions of layer of inhibiting material 602. The resulting layer of insulating material 142 can therefore have its sidewalls 143 vertically (e.g., in the z-direction) positioned above the underlying metallic surface (e.g., top surface $130_s$). Accordingly, via 601 can have a horizontal dimension $W_{601}$ less than or equal to trench conductor layer 130's horizontal dimension $W_{130}$. In some embodiments, such lateral growth can result in layer of insulating material 142 having lower shoulder structure 154 and/or upper shoulder structure 152, each of lower shoulder structure 154 and upper shoulder structure 152 having a warped, rounded, or curved surface.

Referring to FIG. 6C, the removal of layer of inhibitor material 602 can include selectively removing layer of inhibitor material 602 from layer of insulating material 142 and trench conductor layer 130 using a plasma dry etching, a wet etching process, an ashing process, or a combination thereof. By way of example and not limitation, the wet etching can use a mixture of sulfuric acid and hydrogen peroxide (SPM) at about 130° C., and the ashing process can be performed using ozone radicals induced by ultraviolet light source. After the removal of layer of inhibitor material 602, via 601's bottom is open to the underlying trench conductor layer 130. In some embodiments, due to the lateral growth of layer of insulating material 142 during its deposition process, after the removal of layer of inhibitor material 602, via 601's sidewall can accordingly form a footing structure 647 adjacent to bottom trench conductor layer 130. In some embodiments, footing structure 647 is similar to footing structure 147 that previously described. For example, footing structure 647 can have a substantially identical shape as footing structure 147. In some embodiments, footing structure 647 can have a substantially identical volume as footing structure 147.

In some embodiments, a process of forming layer of insulating material 142 can include selectively growing layer of insulating material 142 over S/D padding layer 126 and/or gate padding layer 128 using a selective deposition process, while exposing trench conductor layer 130. By way of example and not limitation, the selective deposition process can include a CVD process or an ALD process. In some embodiments, the selective deposition process can deposit layer of insulating material 142 over an edge portion of top surface 130$_s$ of trench conductor layer 130, while exposing a central portion of top surface 130$_s$ of trench conductor layer 130, where the edge portion can be between the center portion and S/D padding layer 126 or between the center portion and gate padding layer 128.

Referring to FIG. 2, in operation 215, a layer of conductive material is formed over the layer of insulating material and the metallic top surface. For example, as shown in FIG. 9, a layer of conductive material 146 can be formed over layer of insulating material 142 and trench conductor layer 130's top surface 130$_s$, as described with reference to FIGS. 7-9. In some embodiments, the process of forming layer of conductive material 146 can include (i) forming BEOL stack 144 (shown in FIG. 7) over portions of layer of insulating material 142, (ii) depositing one or more conductive materials over semiconductor device 700 of FIG. 7, and (iii) polishing the deposited one or more conductive materials to form layer of conductive material 146 (shown in FIG. 8) using CMP.

Figure 7:
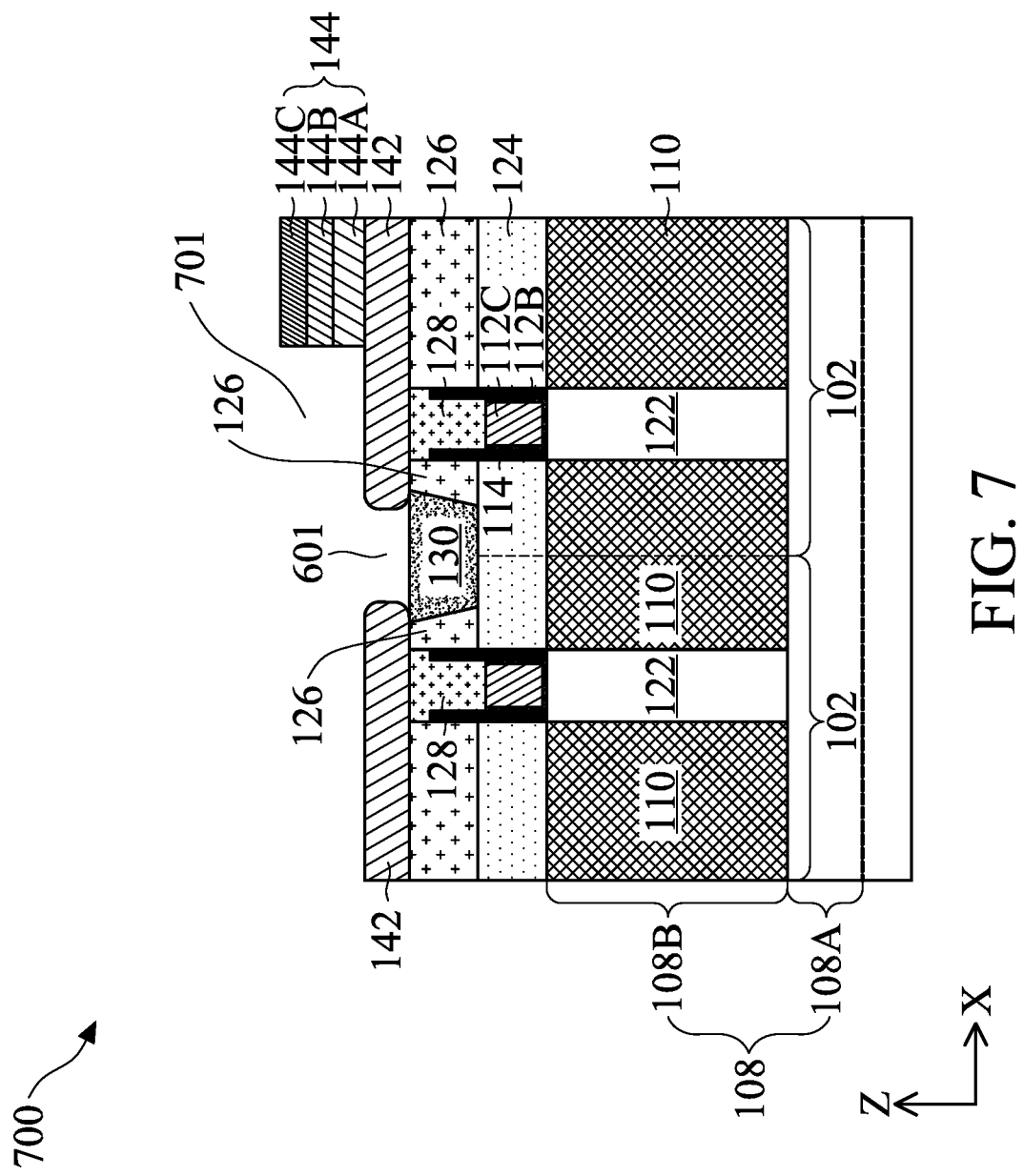

Referring to FIG. 7, by way of example and not limitation, the process of forming BEOL stack 144 can include (i) blanket depositing one or more dielectric layers (e.g., BEOL ESL 144A, BEOL ESL 144B, and BEOL ILD layer 144C) over semiconductor device 600 of FIG. 6C via a deposition process, (ii) masking the one or more deposited dielectric layers using a a photoresist layer (not shown in FIG. 7) defined by a lithography process, and (iii) etching the portions of one or more dielectric layers exposed by the photoresist layer to form via 701 that interconnects via 601 and exposes the metallic surface (e.g., top surface 130$_s$) using a wet etching process or a dry etching (e.g., reactive ion etching) process. In some embodiments, the blanket depositing one or more dielectric layers can be conducted using any suitable deposition method, such as a CVD process, a PECVD process, a PVD process, or an ALD process.

Figure 8:
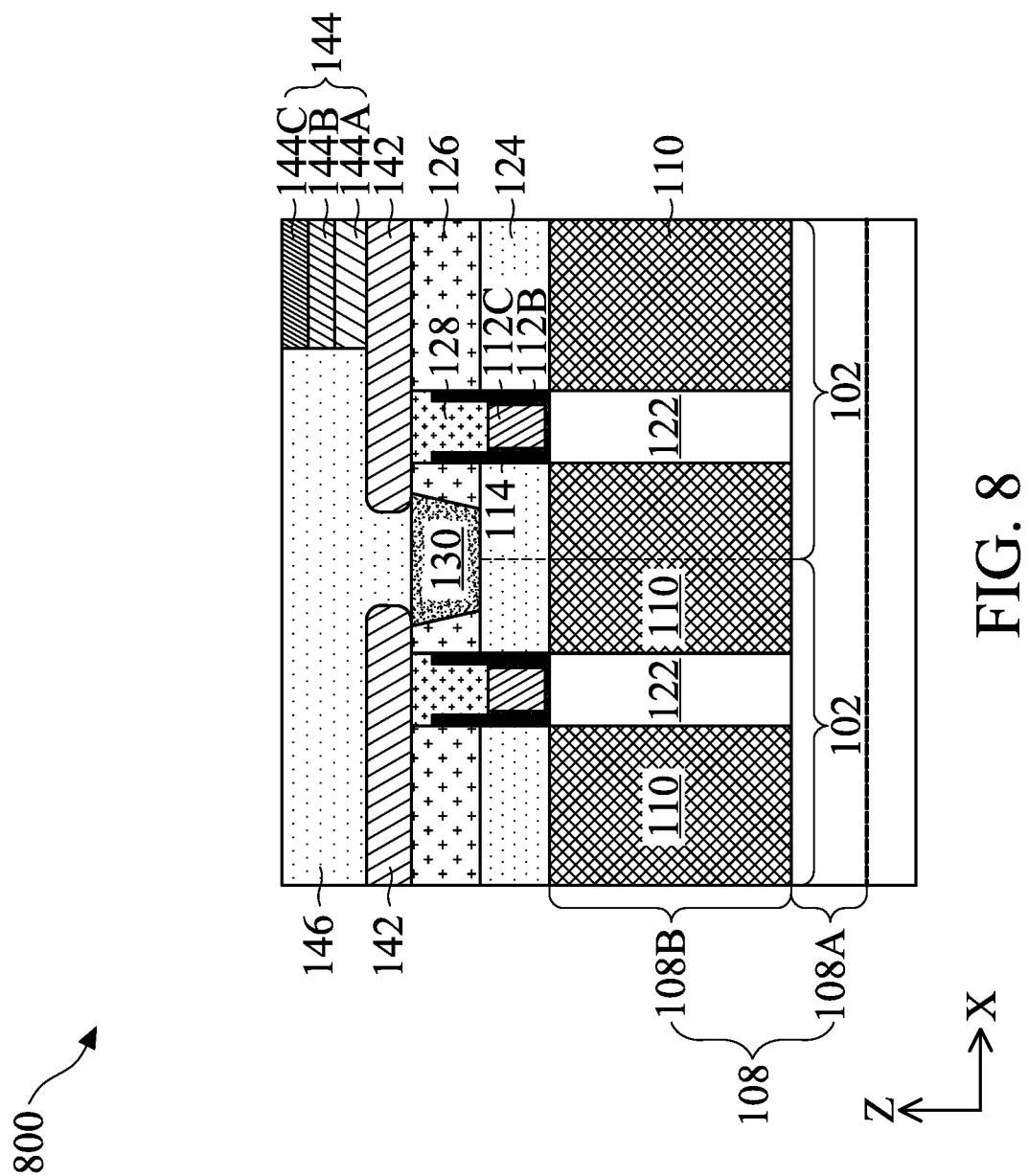
Figure 9:
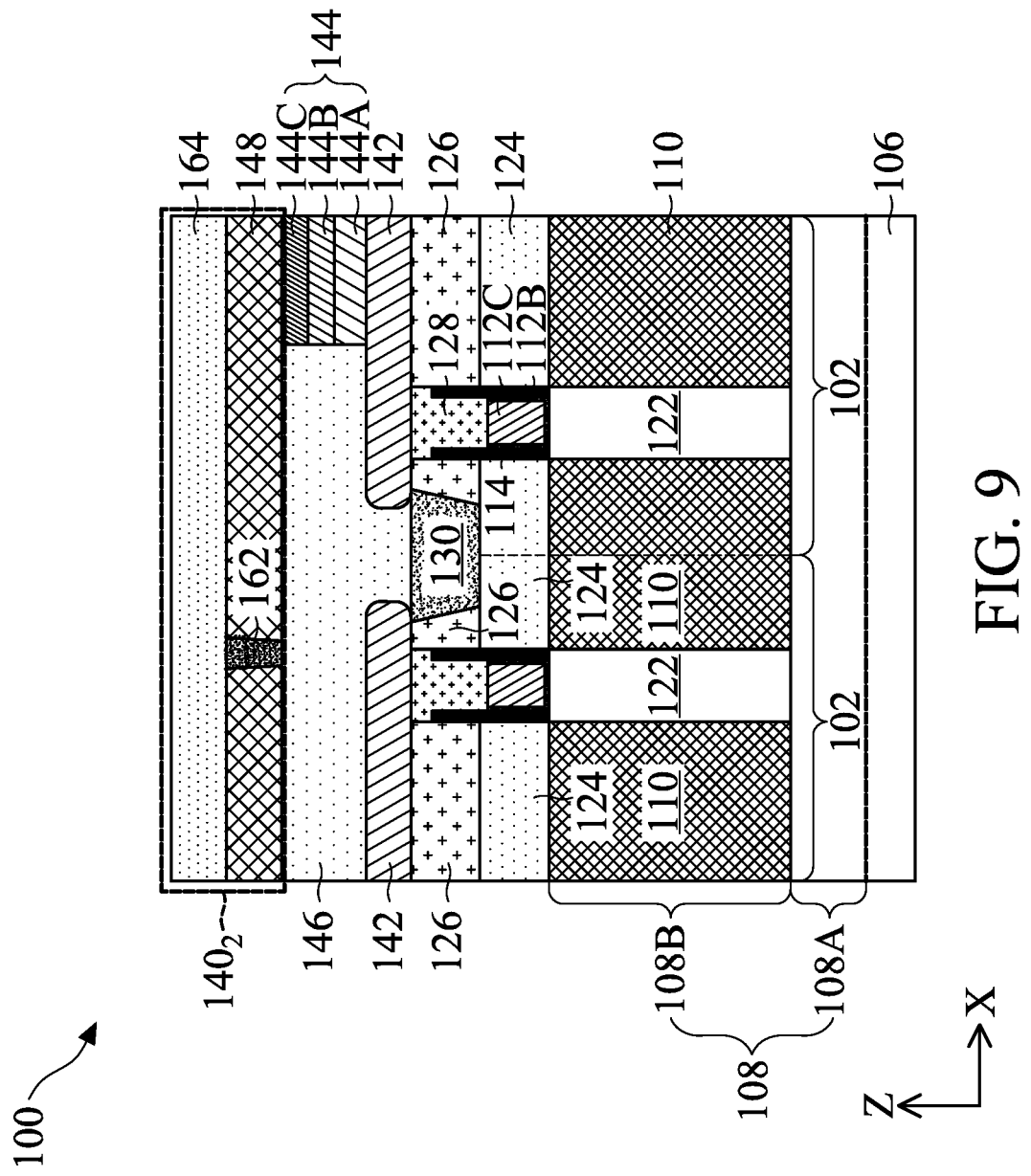

Referring to FIG. 8, the deposition of one or more conductive materials over semiconductor device 700 (shown in FIG. 7) can be conducted by any suitable deposition process, such as CVD, PVD or e-beam evaporation. In some embodiments, the deposition of one or more conductive materials can be conducted by an ALD process configured to grow one or more conductive materials conformal to via 601's sidewall and via 701's sidewall.

Referring to FIG. 2, in operation 220, an interconnect structure is formed over the metal layer. For example, as shown in FIG. 9, interconnect layer 140$_2$ can be formed over layer of insulating material 142. In some embodiments, a process of forming interconnect layer 140$_2$ can include (i) blanket depositing one or more dielectric layers (e.g., layer of insulating material 148) over semiconductor device 800 of FIG. 8 via a suitable deposition process, such as a CVD process, a PECVD process, a PVD process, or an ALD process, (ii) forming a via through the deposited dielectric layers to expose layer of insulating material 142 using a lithography process and an etching process, (iii) filling the via with one or more conductive materials (e.g., to form trench conductor layer 162 using a suitable deposition process (e.g., CVD, ALD, PVD, or e-beam evaporation) and a polishing process (e.g., a CMP process), and (iv) depositing layer of conductive material 164 over depositing one or more dielectric layers (e.g., layer of insulating material 148) using a suitable deposition process (e.g., CVD, ALD, PVD, or e-beam evaporation).

The present disclosure provides an exemplary isolation structure and a method for forming the same. The isolation structure can include a layer of insulating material between the transistor structure and the interconnect structure. In some embodiments, the layer of insulating material can include an upper shoulder structure and a lower shoulder structure. In some embodiments, the method of forming the isolation structure can include selectively depositing one or more insulating materials over dielectric top surfaces of the transistor structure and forming an opening to expose metallic top surfaces of the transistor structure. The isolation structure provides benefits; for example, it enhances an electrical insulation between an interconnect structure and its underlying transistor structure, thus avoiding electrical leakage such as TDDB in the integrated circuit.

In some embodiments, a method for forming an interconnect structure can include forming a first layer of insulating material on a substrate, forming a via recess within the layer of insulating material, filling the via recess with a layer of conductive material, and selectively growing a second layer of insulating material over the first layer of insulating material while opening the second layer of insulating material to the layer of conductive material.

In some embodiments, a method for forming an interconnect structure can include forming a fin structure on a substrate, forming a layer of conductive material over the fin structure, forming a first layer of insulating material over the fin structure and in contact with the layer of conductive material, growing a second layer of insulating material over the first layer of insulating material, and forming a via recess in the second layer of insulating material while growing the second layer of insulating material.

In some embodiments, an interconnect structure can include a substrate, a first layer of insulating material over the substrate, a first layer of conductive material in the first layer of insulating material, and a second layer of insulating material formed over the first insulating layer. The second layer of insulating material can include a top surface, a sidewall and a shoulder structure. The interconnect structure can connect the sidewall to the top surface and can be tapered from the sidewall to the top surface. The interconnect structure can further include a second layer of conductive material formed in the second layer of insulating material and surrounded by the sidewall of the second layer of insulating material.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an interconnect structure, comprising:

forming a first layer of insulating material on a substrate;

removing a portion of the first layer of insulating material to form a via recess within the first layer of insulating material;

filling the via recess with a layer of conductive material;

forming a layer of inhibitor material on the layer of conductive material, wherein forming the layer of inhibitor material comprises depositing the layer of inhibitor material on a top surface of the layer of conductive material without covering an edge portion of the top surface of the layer of conductive material;

selectively growing a second layer of insulating material on a top surface of the first layer of insulating material; and forming, during the selectively growing of the second layer of insulating material, an opening over the layer of inhibiting material.

2. The method of claim 1, wherein the selectively growing the second layer of insulating material comprises depositing the second layer of insulating material over a first portion of the layer of conductive material while forming the opening over a second portion of the layer of conductive material, wherein the first portion of the layer of conductive material is between the first layer of insulating material and the second portion of the layer of conductive material.

3. The method of claim 1, further comprising forming another layer of conductive material over the second layer of insulating material, wherein the another layer of conductive material is in contact with the layer of conductive material.

4. The method of claim 1, further comprising forming another layer of conductive material on the substrate, wherein the first layer of insulating material and the layer of conductive material are over the another layer of conductive material.

5. The method of claim 1, further comprising forming a third layer of insulating material over the second layer of insulating material, wherein the third layer of insulating material is open to the layer of conductive material.

6. The method of claim 1, further comprising removing the layer of inhibitor material to expose the layer of conductive material.

7. The method of claim 1, wherein forming the layer of inhibitor material further comprises forming the layer of inhibitor material having a width of a top surface of the layer of inhibitor material less than a width of a top surface of the layer of conductive material.

8. A method for forming an interconnect structure, comprising:

forming a fin structure on a substrate;

forming a layer of conductive material over the fin structure;

forming a first layer of insulating material over the fin structure and coplanar with the layer of conductive material;

depositing a layer of inhibitor material on a top surface of the layer of conductive material while simultaneously exposing an edge portion of the top surface of the layer of conductive material;

growing a second layer of insulating material on the first layer of insulating material, wherein growing the second layer of insulating material comprises exposing a top surface of the layer of inhibitor material; and forming, during the growing of the second layer of insulating material, a via recess in the second layer of insulating material and over the top surface of the layer of inhibitor material.

9. The method of claim 8, wherein growing the second layer of insulating material comprises forming a curved shoulder structure in the second layer of insulating material, and wherein the shoulder structure connects a side surface of the second layer of insulating material to a bottom surface of the second layer of insulating material.

10. The method of claim 8, further comprising forming a third layer of insulating material on the substrate substantially coplanar with the first layer of insulating material, wherein the first layer of insulating material is between the third layer of insulating material and the layer of conductive material.

11. The method of claim 8, further comprising forming another layer of conductive material in the via recess and over the second layer of insulating material, wherein the another layer of conductive material is in contact with the layer of conducting material.

12. The method of claim 8, further comprising:

forming another layer of insulating material over the substrate;

forming another via recess in the another layer of the insulating material, wherein a bottom of the another via recess is open to the via recess; and forming another layer of conductive material in the via recess and the another via recess.

13. The method of claim 8, further comprising:

forming another layer of conductive material over the fin structure and adjacent to the layer of conductive material; and forming another layer of insulating material between the layer of conductive material and the another layer of conductive material.

14. The method of claim 8, wherein forming the layer of inhibitor material comprises depositing a self-assembled monolayer (SAM) material.

15. A method for forming an interconnect structure, comprising:

forming a fin structure on a substrate;

forming a first layer of insulating material over the fin structure;

etching the first layer of insulating material to form an opening through the first layer of insulating material;

forming a layer of conductive material in the opening;

depositing, on the first layer of insulating material, a second layer of insulating material, wherein forming the second layer of insulating material comprises forming a curved upper shoulder structure and a curved lower shoulder structure of the second layer of insulating material; and forming, during the depositing of the second layer insulating material, a via recess in the second layer of insulating material, wherein a sidewall of the via recess is in contact with the layer of conductive material.

16. The method of claim 15, further comprising:

forming a source/drain contact on the fin structure, wherein the layer of conductive material is in contact with the source/drain contact.

17. The method of claim 15, further comprising:

forming a gate electrode on the fin structure, wherein the layer of conductive material is in contact with the gate electrode.

18. The method of claim 15, further comprising:

forming another layer of conductive material on the second layer of insulating material, wherein the another layer of conductive material is in contact with the layer of conductive material through the via recess.

19. The method of claim 15, wherein the depositing the second layer of insulating material comprises controlling a deposition temperature in a range of about 300° C. to about 700° C.

20. The method of claim 15, wherein depositing the second layer of insulating material comprises forming the curved lower shoulder structure of the second layer of insulating material in contact with the layer of conductive material.

* * * * *